(12) United States Patent
Glent-Madsen

(10) Patent No.: US 7,922,337 B2
(45) Date of Patent: Apr. 12, 2011

(54) METHOD FOR ESTABLISHING A LIGHT BEAM WITH SUBSTANTIALLY CONSTANT LUMINOUS INTENSITY

(75) Inventor: Henrik Glent-Madsen, Låsby (DK)

(73) Assignee: Sign-Tronic AG (CH)

( * ) Notice: Subject to any disclaimer, the term of this patent is extended or adjusted under 35 U.S.C. 154(b) by 994 days.

(21) Appl. No.: 10/598,918

(22) PCT Filed: Mar. 16, 2004

(86) PCT No.: PCT/DK2004/000172
§ 371 (c)(1),
(2), (4) Date: May 22, 2007

(87) PCT Pub. No.: WO2005/088382
PCT Pub. Date: Sep. 22, 2005

(65) Prior Publication Data
US 2007/0297175 A1 Dec. 27, 2007

(51) Int. Cl.
*G03B 21/00* (2006.01)
*G03B 21/20* (2006.01)
*H05B 37/02* (2006.01)
*G01J 4/00* (2006.01)
*G01J 1/32* (2006.01)
*G02F 1/295* (2006.01)
*H01S 3/13* (2006.01)

(52) U.S. Cl. .......... 353/85; 353/121; 347/246; 315/149; 356/243.8; 356/47; 356/370; 250/205; 385/5; 372/29.014

(58) Field of Classification Search ............... 353/85, 353/122, 121; 347/246; 315/149; 356/243.8, 356/47, 370; 250/205; 385/5; 372/29.014
See application file for complete search history.

(56) References Cited

U.S. PATENT DOCUMENTS

| | | | | |
|---|---|---|---|---|
| 4,443,696 A | * | 4/1984 | Taboada | 250/205 |
| 4,732,842 A | | 3/1988 | Kira | |
| 4,804,978 A | * | 2/1989 | Tracy | 347/246 |
| 5,210,657 A | * | 5/1993 | Komazawa et al. | 359/885 |
| 5,829,868 A | * | 11/1998 | Hutton | 362/276 |
| 2002/0018193 A1 | | 2/2002 | Suzuki | |
| 2002/0050564 A1 | | 5/2002 | Birk et al. | |
| 2003/0020412 A1 | | 1/2003 | Luerkens et al. | |

FOREIGN PATENT DOCUMENTS

| | | |
|---|---|---|
| EP | 0329140 | 8/1989 |
| WO | 01/49041 A1 | 7/2001 |
| WO | 2004-032522 A1 | 4/2004 |

\* cited by examiner

*Primary Examiner* — Tony Ko
*Assistant Examiner* — Magda Cruz
(74) *Attorney, Agent, or Firm* — Price, Heneveld, Cooper, DeWitt & Litton, LLP

(57) ABSTRACT

The invention relates to a method for establishing a light beam (CLB) with substantially constant luminous intensity comprising the steps of establishing a light beam (LB) by means of a light source (SAL) and controlling an attenuation of said light beam (LB) on the basis of occurrences of luminous intensity peaks (IP) in said light beam (LB).

41 Claims, 10 Drawing Sheets

Figure 1:
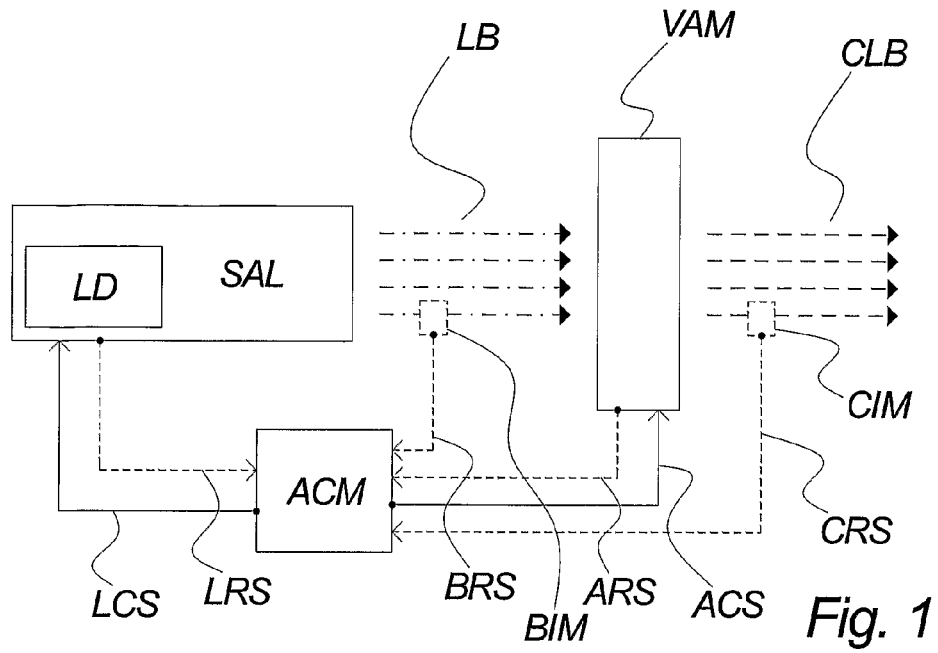

METHOD FOR ESTABLISHING A LIGHT BEAM WITH SUBSTANTIALLY CONSTANT LUMINOUS INTENSITY

FIELD OF THE INVENTION

The present invention relates to a method for establishing a light beam with substantially constant luminous intensity, e.g., relating to short arc lamps driven by peaked AC or DC supplies. The present invention further relates to uses of such a method and an apparatus establishing such a light beam.

BACKGROUND OF THE INVENTION

In several technical fields, illumination is either the main purpose or is used as a tool for obtaining desired results. Applications comprise, e.g., image and movie projection, photolithography, other photographical applications such as production of printed circuit boards, etc., photolysis, rapid prototyping, communication, and several others.

Numerous categories and types of light sources exist for illumination purposes, each manufactured with different purposes in view and often constrained to neglect other purposes. Purposes of interest may be power rating, luminous efficacy, stability of the luminous intensity, precision of the point of emission, color rendering, etc. For example, short arc lamps, i.e., high-pressure discharge lamps, are used in many applications because they may offer high power ratings, high luminous efficacy, excellent color rendering and a very small point of emission. Unfortunately, their construction, however, also causes displacement of material from the electrodes, causing their voltage ratings to change during use, their lifetime to be reduced, and the point of emission, i.e., the arc, to fluctuate. These problems are well known within the art and are addressed in several ways, some of which include the use of alternating driving current and/or frequent current peaking. Often such solutions introduce new problems and in the example of short arc lamps, the current peaking causes the emitted luminous intensity to fluctuate.

Of the above mentioned illumination applications, several do accept light sources establishing light beams having fluctuating luminous intensity and/or fluctuating point of emission, either because they are intended for use in low-quality products, or because the fluctuations may be considered insignificant for a specific use. For example, for use in movie projectors, a slightly fluctuating luminous intensity may be acceptable as the light beam is used to illuminate the same area continuously, for which reason the human eye may not be able to recognize the changes, and furthermore the projected images are changed at a fast pace. Such fluctuations may, however, not be acceptable for specific uses of a high quality projector.

In fields as, e.g., photolithography and other techniques where the region to be exposed is only illuminated little by little, fluctuations of the luminous intensity may, however, be considered hazardous. This is because different regions of the exposed

SUMMARY OF THE INVENTION

The present invention relates to a method for establishing a light beam CLB with substantially constant luminous intensity comprising the steps of:
establishing a light beam LB by means of a light source SAL and
controlling an attenuation of said light beam LB on the basis of occurrences of luminous intensity peaks IP in said light beam LB.

By attenuating the light beam on the basis of the kind and timing of intensity peaks, it is possible to at least partly reject them and thus establish a substantially constant intensity light beam, which is far more acceptable for use in several applications.

The method of the present invention is advantageous as it may be applied to any kind of light sources establishing light beams with any kind of intensity variations, however, for embodiments comprising mechanical variable attenuation means only as long as the intensity variations are either periodical and/or only changing slowly.

The method of the present invention is, furthermore, not restricted to use of a specific kind of variable attenuation means, which allows the manufacturer to choose the means for attenuation that complies with his or her specific requirements and main objectives.

The light source may advantageously comprise means for directing, integrating and possibly focusing the light beam, before it is processed by the variable attenuation means.

According to an embodiment of the present invention, said luminous intensity peaks IP may at least, within a particular time interval, be considered of substantially equal magnitude.

Intensity variations of a light beam are often periodic, as they are caused by periodic changes to the voltage or current driving the light source. For short arc lamps, e.g., it is well known that applying current peaks to the lamp driving current makes the light-emitting arc more stable.

According to an embodiment of the present invention, said luminous intensity peaks IP may at least within a particular time interval be considered of substantially equal magnitude.

Due to the same reasons as why the intensity variations are often periodic, they are also often of the same magnitude. Several kinds of light sources, however, change during prolonged use, e.g., caused by displacement of electrode material, and this may cause the magnitude of the intensity peaks to change.

According to an embodiment of the present invention, said particular time interval is 50 hours, more preferably 200 hours and even more preferably 1000 hours.

The slower the magnitude of the intensity peaks change in proportion to the intensity floor magnitude, the less does the method of the present invention have to compensate for such changes. As the method of the present invention may be applied without the possibility of compensating for such magnitude changes, the intensity of the substantially constant intensity light beam may accordingly become more fluctuating over time in such systems, and the longer the magnitude may be considered constant, the better.

According to a preferred embodiment of the present invention, said controlling an attenuation comprises applying a first level of attenuation to said light beam LB at times where the luminous intensity of said light beam assumes the magnitude of an intensity floor IF and applying a further level of attenuation to the said light beam at times where luminous intensity peaks IP occur.

According to this embodiment of the invention, a first level of attenuation, which is preferably a level of substantially no attenuation, is applied to the light beam when its intensity is at a constant, relatively low, value, i.e., the intensity floor. A second level of attenuation is applied when higher intensities occur, e.g., intensity peaks, in order to moderate them to the same low level as the intensity floor.

According to a preferred embodiment of the present invention, said further level of attenuation is proportioned to the magnitude difference between said luminous intensity peaks IP and said luminous intensity floor IF.

This advantageous embodiment of the present invention causes the intensity peaks to be exactly equalized with the intensity floor and thereby establish a completely constant intensity light beam.

According to an embodiment of the present invention, said attenuation is achieved by means of a variable attenuation means VAM.

A variable attenuation means is placed in the direction of the light beam in order to carry out the attenuation.

According to a preferred embodiment of the present invention, said variable attenuation means VAM is capable of applying at least two different levels of attenuation to said light beam LB.

As described above, at least a level of preferably no attenuation and a level that equalizes the peaks are required in order for the method to succeed. Preferably more than two levels of attenuation are available in order to enable the variable attenuation means to equalize different magnitudes of intensity peaks.

According to a preferred embodiment of the present invention, one of said at least two different levels of attenuation represents substantially no attenuation.

To avoid loss of more intensity than necessary, the low level of attenuation applied when the light beam is at the intensity floor level should be substantially none, i.e., the variable attenuation means VAM placed in the light beams' direction should be completely transparent. This is, however, not obtainable for several of the attenuation means applicable, and a low attenuation, not substantially zero, may be acceptable in a balancing between this and other preferences such as speed.

According to a preferred embodiment of the present invention, an attenuation control means ACM is coupled to said variable attenuation means VAM.

The attenuation control means ACM may be a separate device, but may equally well be integrated into the lamp driver LD or the variable control means VAM.

According to a preferred embodiment of the present invention, said attenuation control means ACM controls which of said at least two different levels of attenuation that is applied to said light beam LB by means of an attenuation control signal ACS.

The attenuation control means is coupled to the variable attenuation means by a control signal ACS. The attenuation control means at least partly determines when the variable attenuation mean should change its attenuation level.

According to a preferred embodiment of the present invention, said attenuation control means ACM is coupled to a lamp driver LD that drives said light source SAL.

Thereby, the attenuation control means may act on and/or control both the lamp driver and the variable attenuation means to obtain the best possible rejection of intensity peaks.

According to a preferred embodiment of the present invention, said attenuation control means ACM controls the timing of said luminous intensity peaks IP by means of a lamp driver control signal LCS.

At least in cases where the lamp driver LD causes the intensity peaks, they may be controlled by coupling the attenuation control means to the lamp driver. The timing of intensity peaks refer to the frequency, periodicity, duration, etc.

According to a preferred embodiment of the present invention, said attenuation control means ACM controls the magnitude of said luminous intensity peaks IP by means of a lamp driver control signal LCS.

At least in cases where the lamp driver LD causes the intensity peaks, their magnitude may be controlled by coupling the attenuation control means to the lamp driver.

According to a preferred embodiment of the present invention, said attenuation control means ACM receives a lamp driver reference signal LRS comprising information about properties of said luminous intensity peaks IP.

Properties of the luminous intensity peaks IP comprise frequency, duration, magnitude, stability, etc. The lamp driver reference signal may be obtained by measuring various values inside the lamp driver or the lamp source, or merely by coupling the reference signal to the power cord for the lamp.

According to a preferred embodiment of the present invention, said attenuation control means ACM controls which of said at least two different levels of attenuation that is applied to said light beam LB by means of said attenuation control signal ACS at least partly on the basis of said lamp driver reference signal LRS.

On the basis of the attenuation reference signal, the attenuation control means is better facilitated in respect of controlling the lamp driver in order to establish intensity peak in synchronization with the variable attenuation means.

According to an embodiment of the present invention, said attenuation control means ACM receives an attenuation reference signal ARS comprising information about properties of said variable attenuation means VAM.

Properties of the variable attenuation means differ from type to type and may comprise frequency of attenuation, duration of attenuation, degree of attenuation, etc.

The attenuation reference signal may be obtained by measuring various electrical values or by applying transducers, revolution meters, IR-transceivers, etc., to the physical attenuation means.

According to an embodiment of the present invention, said attenuation control means ACM controls properties of said luminous intensity peaks IP by means of said lamp driver control signal LCS at least partly on the basis of said attenuation reference signal ARS.

On the basis of the attenuation reference signal, the attenuation control means stands is better facilitated in respect of controlling the lamp driver in order to establish intensity peak in synchronization with the variable attenuation means.

According to an embodiment of the present invention, said attenuation control means ACM receives a light beam reference signal BRS derived from an intensity measuring device BIM adapted to measure the intensity of the light beam LB.

By gaining access to the actual light beam instead of merely interpolating its behavior from other information makes it possible for the attenuation control means to better control the variable attenuation control means in synchrony.

According to a preferred embodiment of the present invention, said attenuation control means ACM receives a constant light beam reference signal CRS derived from an intensity measuring device CIM adapted to measure the intensity of said substantially constant intensity light beam CLB.

By gaining access to the actual constant intensity light beam, it is possible for the attenuation control means to measure its own performance. As the constant intensity light beam is expected to have a substantially constant intensity, any intensity variations indicate glitches in the attenuation procedure currently in use. This feedback may, thus, enable the attenuation control means to adaptively improve its own performance.

According to a preferred embodiment of the present invention, said attenuation control means ACM controls properties of said luminous intensity peaks IP by means of said lamp driver control signal LCS at least partly on the basis of said light beam reference signal BRS, said constant light beam reference signal CRS or a combination thereof.

On the basis of the light beam reference signal BRS, the attenuation control means may derive the timing and magnitude of intensity variations of the light beams. On the basis of both reference signals by, e.g., subtracting them, the attenuation control means may derive the timing and degree of attenuation applied by the variable attenuation means. On the basis of the constant light beam reference signal CRS, the attenuation control means may directly detect any shortcomings of the attenuation method. On the basis of one or more of this information, the attenuation control means may be able to better control the lamp driver and light source.

According to an embodiment of the present invention, said attenuation control means ACM controls which of said at least two different levels of attenuation that is applied to said light beam LB by means of said attenuation control signal ACS at least partly on the basis of said light beam reference signal BRS, said constant light beam reference signal CRS or a combination thereof.

On the basis of one or more of the information derivable from the reference signals, the attenuation control means may be able to better control the variable attenuation means.

According to an embodiment of the present invention, said attenuation control means ACM controls said variable attenuation means VAM, said lamp driver LD or both at least partly on the basis of predefined settings.

In simple, low-quality or less demanding applications, the attenuation control means may from the manufacturer or by the user be set to control the attenuation means and/or the lamp driver only or partly on the basis of predefined parameters. Such parameters may be established on the basis of theoretical estimations or experience.

For some light sources and setups this may probably work well, whereas for several applications this will potentially cause even disturbance of the light beam.

According to a preferred embodiment of the present invention, said attenuation control means ACM continuously controls said variable attenuation means VAM, said lamp driver LD, or both.

By controlling the attenuation means and/or lamp driver continuously, the attenuation control means is able to quickly adapt to changes in the peaking pattern.

According to a preferred embodiment of the present invention, said attenuation control means ACM establishes a synchronization between the timing of the application of said first and further levels of attenuation and the timing of said luminous intensity peaks IP.

When the variable attenuation means work in the right synchrony with the intensity peaks, a light beam with substantially constant luminous intensity has been established.

According to a preferred embodiment of the present invention, said variable attenuation means VAM is a multi-level variable attenuation means MVAM.

In order to facilitate equalization of intensity peaks of different magnitudes, the variable attenuation means has to be of a multi-level variable attenuation means type.

Thereby, a variable attenuation means is referred to being capable of applying at least three, and preferably numerous different levels of attenuation to the light beam.

According to a preferred embodiment of the present invention, said multi-level variable attenuation means MVAM is capable of applying infinite levels of attenuation to said light beam LB.

This advantageous preferred embodiment of a variable attenuation means offers infinite or practically infinite levels of attenuation. Thereby, any magnitude of intensity peaks may be equalized with the intensity floor and a substantially constant intensity light beam will be established.

According to an embodiment of the present invention, said attenuation control means ACM controls which of said infinite levels of attenuation that said multi-level variable attenuation means MVAM applies to the light beam LB at least partly on the basis of the magnitude difference between the intensity peaks IP and the intensity floor IF.

According to this embodiment, the attenuation control means is able to choose the attenuation level that comes closest to the level needed.

According to a preferred embodiment of the present invention, said attenuation control means ACM regulates which of said infinite levels of attenuation that said multi-level variable attenuation means MVAM applies to the light beam LB at least partly on the basis of feedback from a constant light beam intensity measuring device CIM.

According to this advantageous embodiment of the present invention, the attenuation control means may adaptively change the attenuation level of the multilevel variable attenuation means in order to establish the most constant intensity light beam possible.

According to an embodiment of the present invention, said attenuation control means ACM controls which of said infinite levels of attenuation that said multi-level variable attenuation means MVAM applies to the light beam LB at least partly on the basis of user input.

As the kind of intensity changes that requires the variable attenuation means to offer multiple levels of attenuation often occurs very slowly, e.g., due to displacement of electrode material, the variable attenuation means may only need to be adjusted relatively seldom. Such adjustments may be based on measurements of the intensity peaks' magnitudes or monitoring of the degree of intensity variations of the substantially constant intensity light beam. Furthermore, the multi-level variable attenuation means may be embodied in such a way that the attenuation control means is not able to change the attenuation level automatically.

According to an embodiment of the present invention, said attenuation control means ACM controls which of said infinite levels of attenuation that said multi-level variable attenuation means MVAM applies to the light beam LB at least partly on the basis of said lamp driver reference signal LRS.

The lamp driver or light source may offer to inform the attenuation control means of the current magnitude of intensity peaks.

According to an embodiment of the present invention, said attenuation control means ACM controls which of said infinite levels of attenuation that said multi-level variable attenuation means MVAM applies to the light beam LB at least partly on the basis of the elapsed time of light source usage.

As an alternative to a user adjusting the attenuation level based on his or her experience, the attenuation control means may incorporate some kind of usage monitoring, e.g., a clock, and at predefined times automatically adjust the attenuation level to predefined levels. This still causes the adjustment to be based on experience or estimations but does not require user interaction.

According to a preferred embodiment of the present invention, said attenuation control means ACM promotes compensation for light beam property changes caused by prolonged use of said light source SAL.

According to this advantageous embodiment of the present invention, the method is able to compensate for slow changes in the light beam happening over time.

According to an embodiment of the present invention, said light beam property changes comprise intensity peak IP magnitude changes.

When the light source is a short arc lamp, the slowly happening changes of the light beam may be changes of the intensity peak magnitude.

According to an embodiment of the present invention, said variable attenuation means VAM comprises a wheel W rotating around a center of rotation COR, said center of rotation being displaced from the center of a cross section of said light beam LB in a direction perpendicular to the direction of said light beam, at least by a distance corresponding to the radius of said cross section.

The wheel may be driven by any suitable kind of actuator, e.g., an electromotor. The wheel is preferably circular, but may have any shape and the center of rotation is preferably the center of the wheel. By using a rotating wheel for variable attenuation means, the frequency and duration of attenuations are easy to maintain constant, but on the other hand, hard to change and only slow changes are possible. For most wheel-based variable attenuation means embodiments it applies that the ratio between the frequency of attenuation and the duration of attenuation is constant, as the time a specific point on the wheel is within the light beam changes with the rotational speed.

According to an embodiment of the present invention, said wheel W comprises at least one transparent section TS.

The wheel may, e.g., be made of transparent material such as, e.g., Plexiglass, glass, etc. but a transparent section may also be inserted into a wheel made of opaque material. The number of transparent sections may be determined on the basis of specific intensity peak timing schemes, but is preferably one. Preferably, the transparency of the transparent section should be as complete as possible and also influence other light properties such as color composition, polarization, etc. as little as possible.

According to an embodiment of the present invention, said wheel W comprises at least one cutout section CS.

In order to obtain the best possible transparency and least influence on other light parameters, a section of the wheel may be cut out.

According to an embodiment of the present invention, said wheel W comprises at least one semi-transparent shaded section SS.

Levels of attenuations not substantially zero may be obtained by shading one or more sections of the wheel in such a way that they become semi-transparent. The opacity of the shaded sections should correspond to the magnitude difference between the intensity peaks and the intensity floor, i.e., the desired attenuation.

According to an embodiment of the present invention, said wheel W comprises at least one semi-transparent raster section RS.

As an alternative to shaded sections, sections may be made semi-transparent by applying a raster pattern to them.

According to an embodiment of the present invention, said wheel W comprises at least one perforated section PS.

As a further alternative, levels of attenuation may be obtained by perforating a section of the wheel.

According to an embodiment of the present invention, said rotation of said wheel W is at least partly controlled by said attenuation control means ACM.

By enabling the attenuation control means to control the rotation of the wheel, an advantageous embodiment has been obtained, as the attenuation control means, thereby, is able to control the attenuation frequency and duration.

According to an embodiment of the present invention, said wheel W comprises several semi-transparent sections SS1, SS2, SS3 each having different opacity.

To enable the wheel to be used in a multi-level variable attenuation means embodiment, several semi-transparent sections, either shaded, raster or perforated sections, may be created, with different opacities. The different opacities may be clearly parted or fade into each other.

According to an embodiment of the present invention, said wheel W is displaceable in a direction perpendicular to the direction of said light beam LB by a user.

In order to be able to choose among different shaded sections SS1, SS2, SS3, the wheel may be displaced perpendicular to the light beam.

According to a preferred embodiment of the present invention, said wheel W is displaceable in a direction perpendicular to the direction of said light beam LB at least partly under control from said attenuation control means ACM.

By this preferred embodiment, the attenuation control means is able to control the level of attenuation applied by the variable attenuation means.

According to an embodiment of the present invention, said variable attenuation means VAM comprises a diaphragm DP establishing an aperture AP of variable size.

By embodying the variable attenuation means in the form of a diaphragm with variable aperture size, a multi-level variable attenuation means has been obtained. If using a diaphragm that ranges from completely open to completely closed aperture, infinite levels of attenuation may be applied to the light beam.

According to a preferred embodiment of the present invention, said size of said aperture AP is at least partly controlled by said attenuation control means ACM.

By this preferred embodiment, the attenuation control means is able to control the level of attenuation applied by the variable attenuation means.

According to an embodiment of the present invention, said variable attenuation means VAM comprises an opaque plate OP and mounting means AR allowing said opaque plate in a variable degree to obstruct said light beam.

As the opaque plate may obstruct the light beam in any degree, a multi-level variable attenuation means has been obtained. The plate may be mounted in any suitable way. A preferred embodiment comprises mounting the plate on an arm directed perpendicularly away from the light beam and rotating the plate around the axis of that arm. See FIG. 9.

According to an embodiment of the present invention, said degree of obstruction is at least partly controlled by said attenuation control means ACM.

By this preferred embodiment, the attenuation control means is able to control the level of attenuation applied by the variable attenuation means.

According to an embodiment of the present invention, said variable attenuation means VAM comprises a displaceable sheet SH, said displacement being allowed in a plane perpendicular to the direction of said light beam LB.

The displacement of the sheet may be performed by any suitable kind of actuator or similar means. By being displaceable in a plane perpendicular to the light beam, any section of the sheet may be placed in the light beam.

According to an embodiment of the present invention, said sheet SH comprises at least one transparent section TS.

The sheet may, e.g., be made of transparent material such as, e.g., Plexiglass, glass, etc. but a transparent section may also be inserted into a sheet made of opaque material. The number of transparent sections may be determined on the basis of specific intensity peak timing schemes, but is preferably one. Preferably, the transparency of the transparent section should be as complete as possible and also influence other light properties such as colour composition, polarization, etc. as little as possible.

According to an embodiment of the present invention, said sheet SH comprises at least one cutout section CS.

In order to obtain the best possible transparency and the least influence on other light parameters, a section of the sheet may be cutout.

According to an embodiment of the present invention, said sheet SH comprises at least one semi-transparent shaded section SS.

Levels of attenuations not substantially zero may be obtained by shading one or more sections of the sheet in such a way that they become semi-transparent. The opacity of the shaded sections should correspond to the magnitude difference between the intensity peaks and the intensity floor, i.e., the desired attenuation.

According to an embodiment of the present invention, said sheet SH comprises at least one semi-transparent raster section RS.

As an alternative to shaded sections, sections may be made semi-transparent by applying a raster pattern to them.

According to an embodiment of the present invention, said sheet SH comprises at least one perforated section PS.

As a further alternative, levels of attenuation may be obtained by perforating a section of the sheet.

According to an embodiment of the present invention, said sheet SH comprises several semi-transparent sections SS1, SS2, SS3 each having different opacity.

To enable the sheet to be used in a multi-level variable attenuation means embodiment, several semi-transparent sections, either shaded, raster or perforated sections, may be created with different opacities. The different opacities may be clearly parted or fade into each other.

According to an embodiment of the present invention, said displacement of said sheet SH is at least partly controlled by said attenuation control means ACM.

By this preferred embodiment, the attenuation control means is able to control the level of attenuation applied by the variable attenuation means.

According to an embodiment of the present invention, said displacement of said sheet SH is at least partly controlled by a user.

The different attenuation levels of a sheet forming a multi-level variable attenuation means may be established in such a way that the attenuation control means is not able to control which one is used, or alternatively the attenuation control means has no possibilities of determining what level to apply. A user may then from time to time adjust the level manually. Such an adjustment may also comprise exchanging one sheet with another having better suited levels of attenuation available.

According to an embodiment of the present invention, said variable attenuation means VAM comprises at least one spatial light modulator SLM.

Any spatial light modulator may be used with a variable attenuation means embodiment. Most spatial light modulators offer inherently numerous or practically infinite levels of attenuation, e.g., 600.000 levels. Spatial light modulators are, furthermore, precise and very fast when changing level and do not need to go through several incorrect levels before reaching the desired one.

According to an embodiment of the present invention, said spatial light modulator SLM is of a magneto-optic type.

Such a modulator may, e.g., comprise a crystal of yttrium iron garnet, where using a magnetic field to produce optical rotation may modulate the intensity of a light beam passed through it. In an alternative embodiment, a surface applying different property changes to light reflected on it, e.g., due to the magneto-optic Kerr effect, is used. Any alternative magneto-optic modulators that may control light intensity, whether letting light through or reflecting it, may be used within the scope of the invention.

Any alternative magneto-optic modulators that may control light intensity, whether letting light through or reflecting it, may be used within the scope of the invention.

According to an embodiment of the present invention, said spatial light modulator SLM is of an electro-optic type.

Such a modulator may, e.g., comprise a liquid crystal display (LCD) or any other electro-optic modulator or device. It may be transmissive or reflecting the light.

According to an embodiment of the present invention, said spatial light modulator SLM is of an acousto-optic type.

Such a modulator may, e.g., comprise Bragg cells, or any other acousto-optic modulator or device, whether it is transmissive or reflecting the light.

According to an embodiment of the present invention, said spatial light modulator SLM is a liquid crystal display.

When a liquid crystal display (LCD) is used for modulating the light beam, a fast and multi-level variable attenuation means has been obtained.

According to an embodiment of the present invention, said spatial light modulator SLM is a micro-mechanical shutter array.

When a micro-mechanical shutter array is used for modulating the light beam, a fast and multi-level variable attenuation means has been obtained.

According to an embodiment of the present invention, said spatial light modulator SLM is a DMD modulator.

When a DMD modulator is used for modulating the light beam, a fast and multi-level variable attenuation means has been obtained.

According to an embodiment of the present invention, said spatial light modulator SLM is at least partly controlled by said attenuation control means ACM.

When the attenuation control means at least partly controls the attenuation applied by the spatial light modulator, an advantageous embodiment of the present invention has been obtained.

According to an embodiment of the present invention, said variable attenuation means VAM comprises at least one pivotally mounted mirror PM and at least one attenuation filter AF.

The pivotally mounted mirror may be pivoting upon any axis in its own plane, e.g., an axis through its center, or an axis along one of its edges. The attenuation filter AF may be any means for attenuating light comprising, e.g., any of the previously mentioned means.

According to a preferred embodiment of the present invention, said variable attenuation means VAM comprises means for changing the direction of said light beam LB.

Such means for changing the direction of the light beam may comprise mirrors, crystals, optical fibers or other light guides. The direction means may be fixed, e.g., in order to compress the extension of the embodiment by conducting the light back and forth instead of along a straight line or in order to facilitate a variable attenuation means or other component that reflects or breaks light instead of passing it straight through, or they may be variable, e.g., to facilitate the use of variable attenuation means requiring the light beam to be displaceable.

According to a preferred embodiment of the present invention, the luminous intensity of said established light beam with substantially constant luminous intensity CLB is completely constant.

According to this preferred, advantageous embodiment of the present invention, the established light beam CLB has completely constant luminous intensity.

According to an embodiment of the present invention, the luminous intensity of said established light beam with substantially constant luminous intensity CLB is constant within a tolerance of 50%, more preferable within a tolerance of i10%, and even more preferably within a tolerance of i 1%.

According to this embodiment of the present invention, a light beam CLB is established possibly having a slightly fluctuating luminous intensity but compared to the intensity pattern of the light beam LB, where the magnitude of the intensity peaks may be, e.g., 150 to 200% of the intensity floor, it is a far more constant and acceptable light beam.

According to an embodiment of the present invention, the luminous energy conducted by said established light beam with substantially constant luminous intensity CLB during one peaking period is within 10%, more preferable within 5%, and even more preferably within 1%, of the luminous energy conducted during a nominal period.

The time span from the start of one current peak to the start of the next current peak is referred to as a peaking period. The corresponding time span of a light beam with constant intensity at the intensity floor level is referred to as a nominal period, i.e., a light beam without peaks. According to this embodiment of the present invention, a light beam CLB is established possibly having a slightly fluctuating luminous intensity, but the energy conducted, i.e., the accumulated intensity over time, is far closer to the energy conducted by a perfectly constant intensity light beam, than the energy conducted by the light beam LB. Thereby, the substantially constant intensity light beam CLB of the present invention is far easier to utilize within sensitive applications.

According to a preferred embodiment of the present invention, said light source SAL is a short arc lamp.

It is well known in the art that short arc lamps perform better when driven by peaked alternating current. As this peaking may be established completely periodically and even may be varied to a certain extent, the present invention is particularly useful in applications using short arc lamps.

According to a preferred embodiment of the present invention, said lamp driver LD establishes an alternating current with current peaks CP for driving said light source SAL.

This is the preferred way to drive a short arc lamp, at least regarding the precision and life extent of the lamp. The present invention may be used to overcome the related problems.

According to an embodiment of the present invention, said lamp driver LD establishes a direct current with current peaks CP for driving said light source SAL.

This is an alternative but yet widely used way to drive a short arc lamp and the present invention may be used in relation to that kind of application as well.

The present invention further relates to a use of the method described above in a light modulating arrangement used for photolithography.

As such applications often use short arc lamps and as the present invention is particularly useful for use in short arc lamp applications, the present invention may be used in such an application with significant advantage.

The present invention further relates to a use of the method described above in a light modulating arrangement used for image projection.

The present invention may also be used in projectors and similar applications with advantage.

Furthermore, the present invention has several further uses. It may advantageously be used, e.g., for exposing printed circuit boards in connection with the manufacture of such boards, rapid prototyping, i.e. manufacture of three-dimensional models by a process well-known as rapid prototyping, exposing offset plates and films and, e.g., in serigraphy applications, in photo finishing processes, in biomedical applications, e.g., for research regarding DNA profiles, in projection applications and signs, in digital cinema applications, etc., and in any other application or process comprising light sources.

The present invention further relates to an apparatus establishing a light beam CLB with substantially constant luminous intensity comprising a light source SAL establishing a light beam LB, a variable attenuation means VAM, and an attenuation control means ACM; wherein said light beam is moderated into a light beam CLB with substantially constant luminous intensity by means of the method described above.

Thereby, an advantageous embodiment is established for use in any illumination application.

Figure 2:
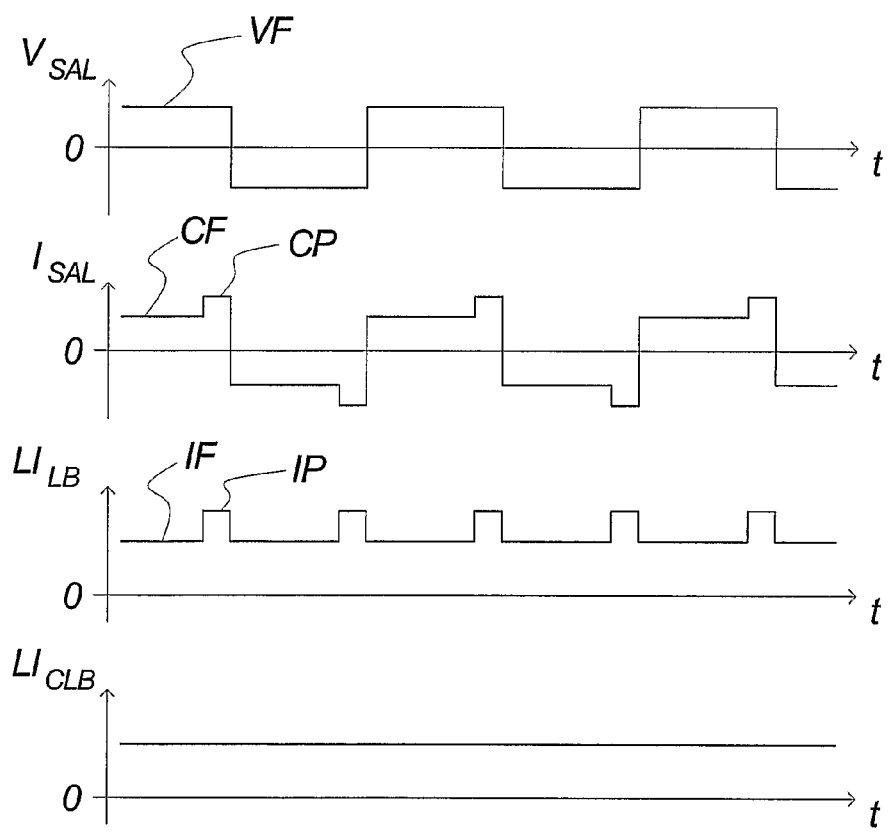
Figure 3:
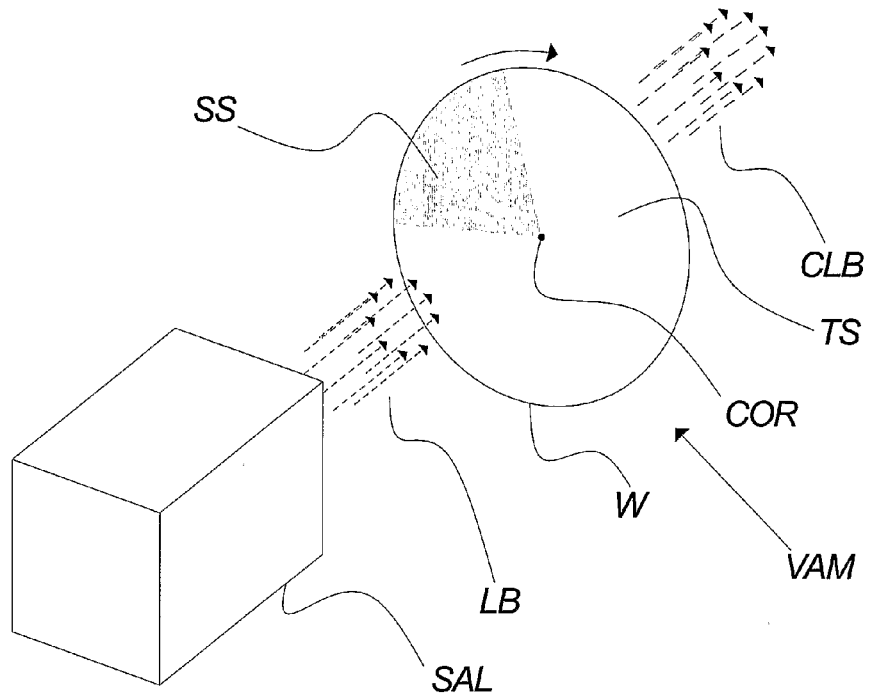
Figure 4:
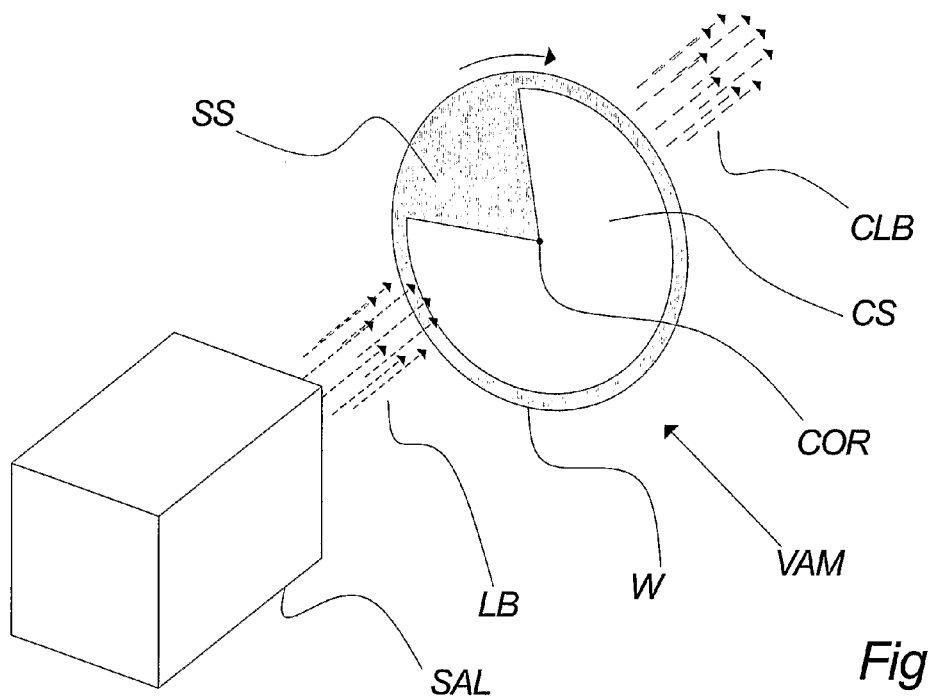
Figure 5:
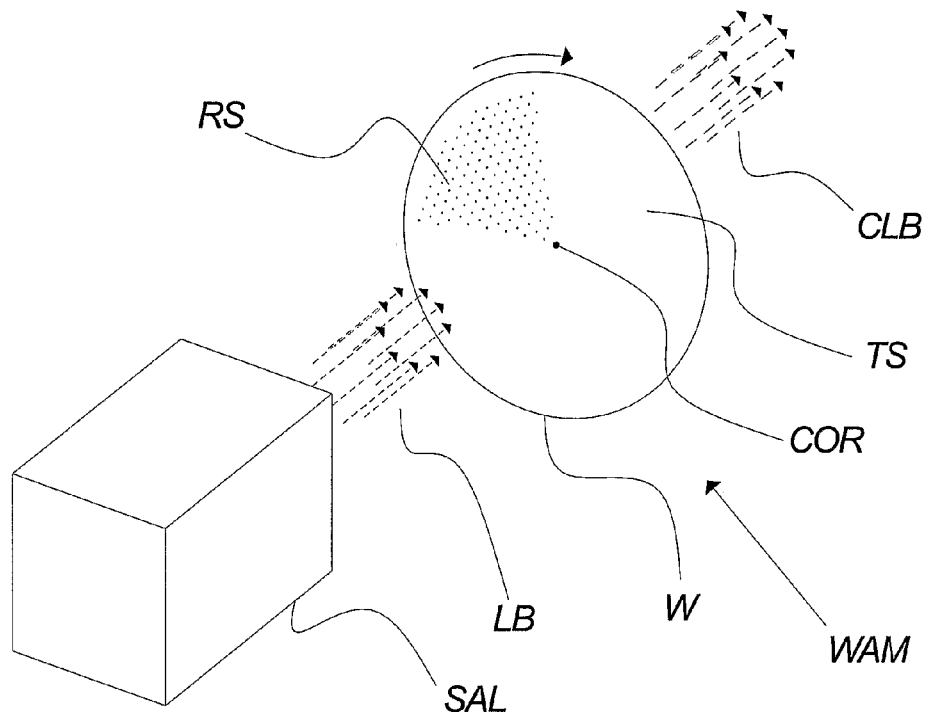
Figure 6:
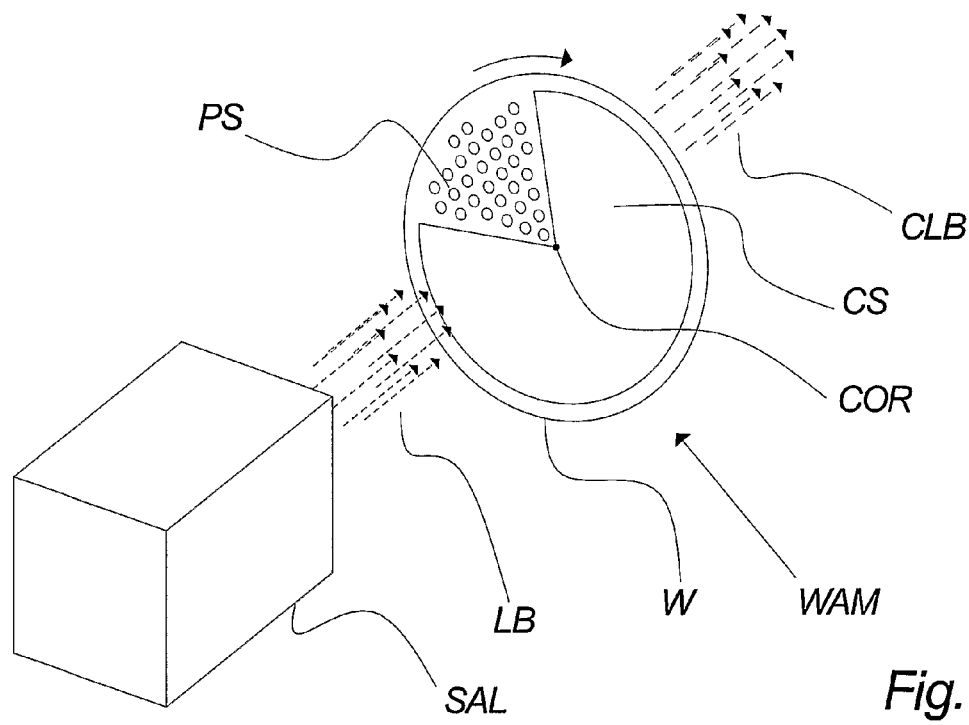
Figure 7:
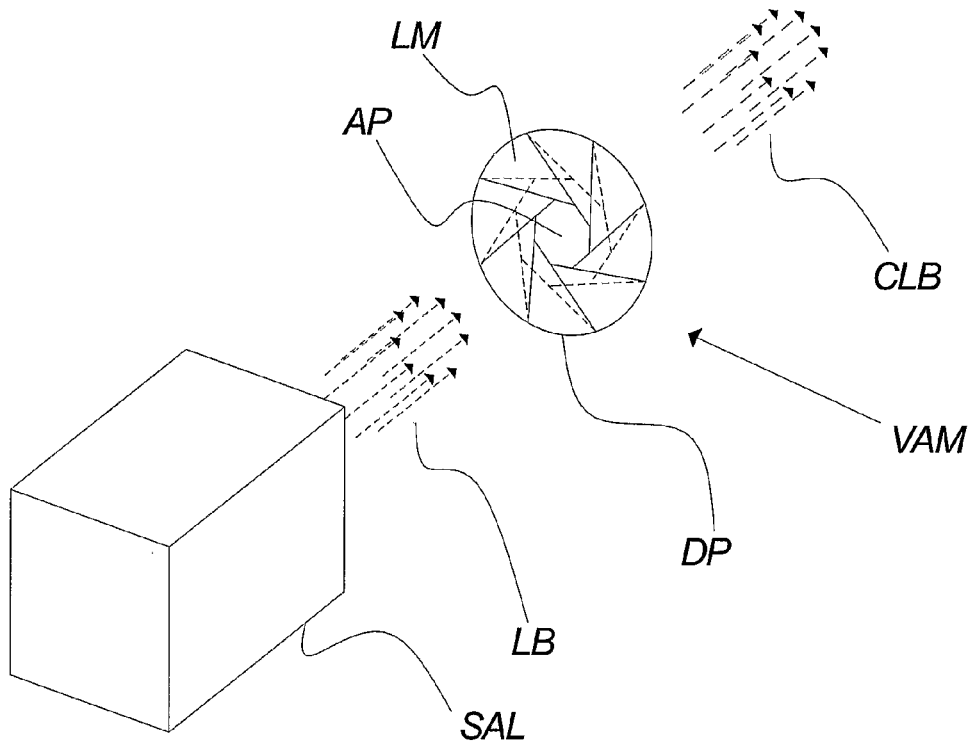
Figure 8:
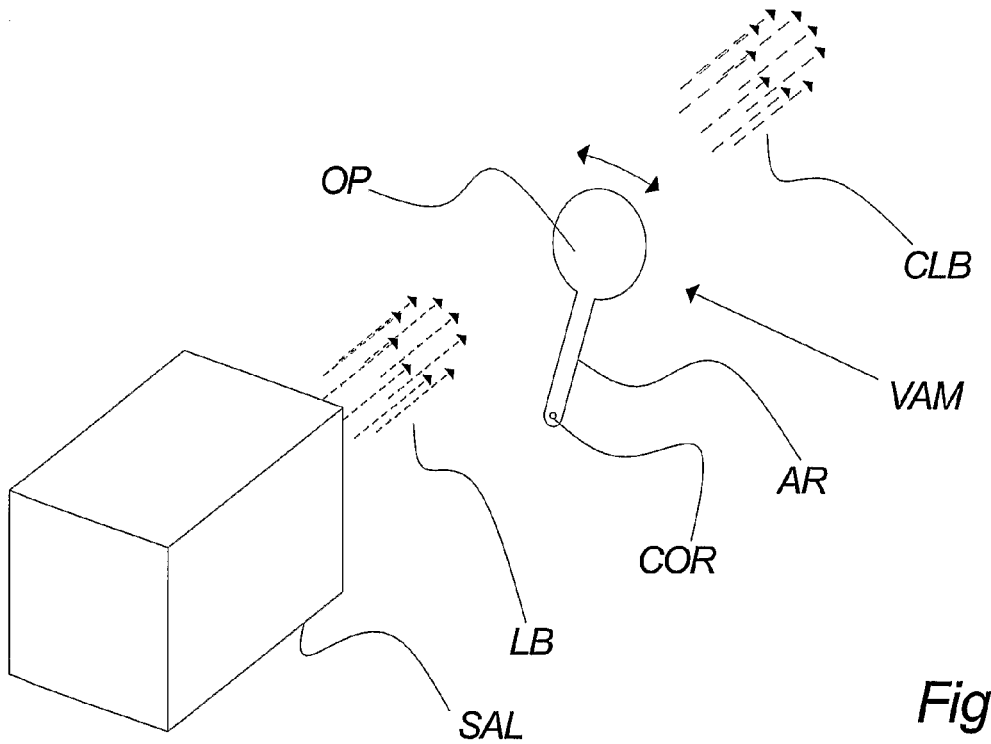
Figure 9:
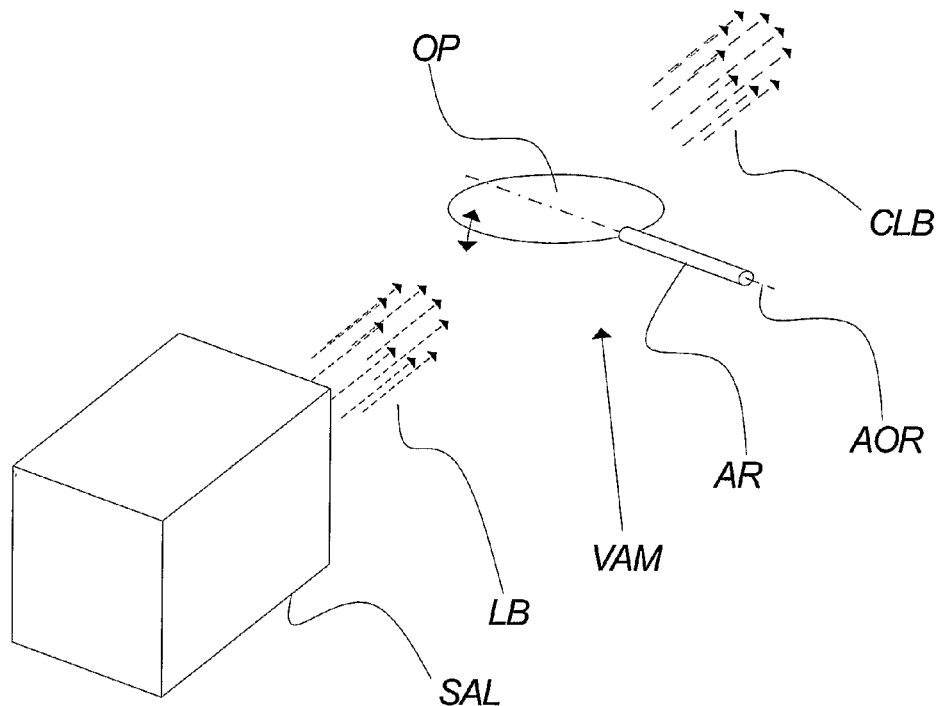
Figure 10:
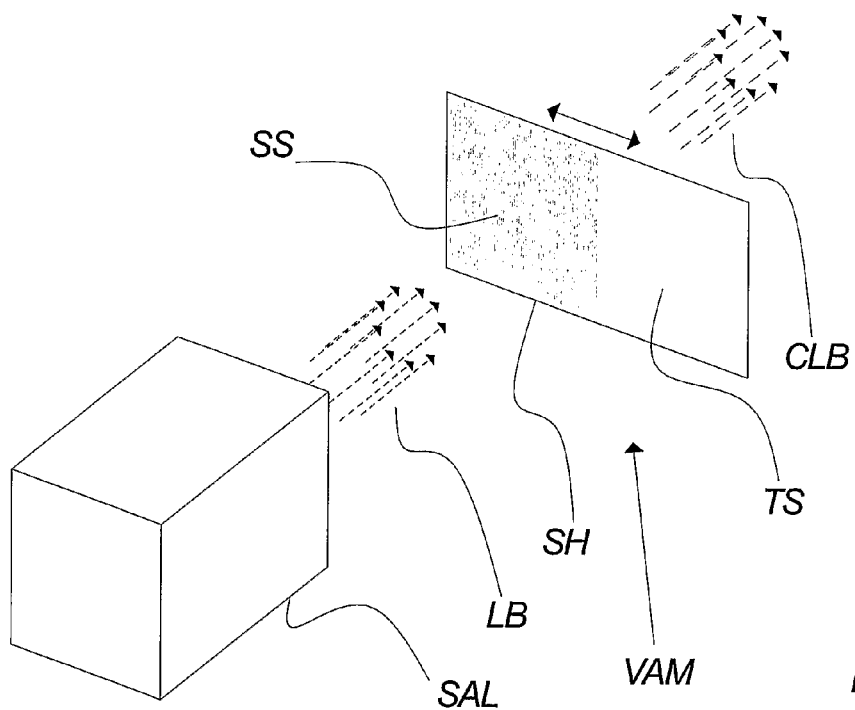
Figure 11:
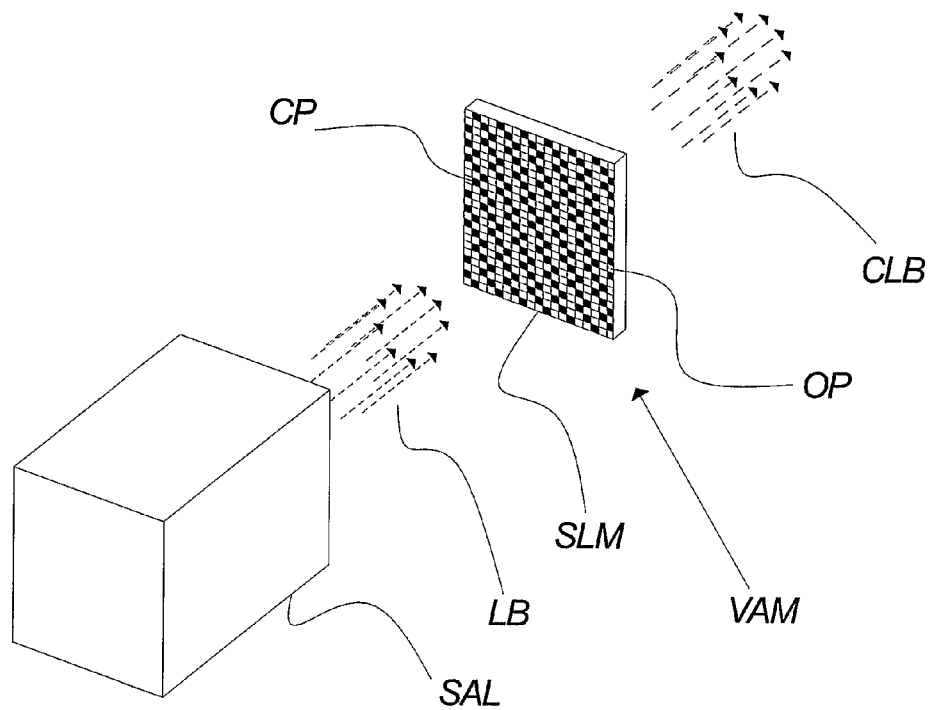
Figure 12:
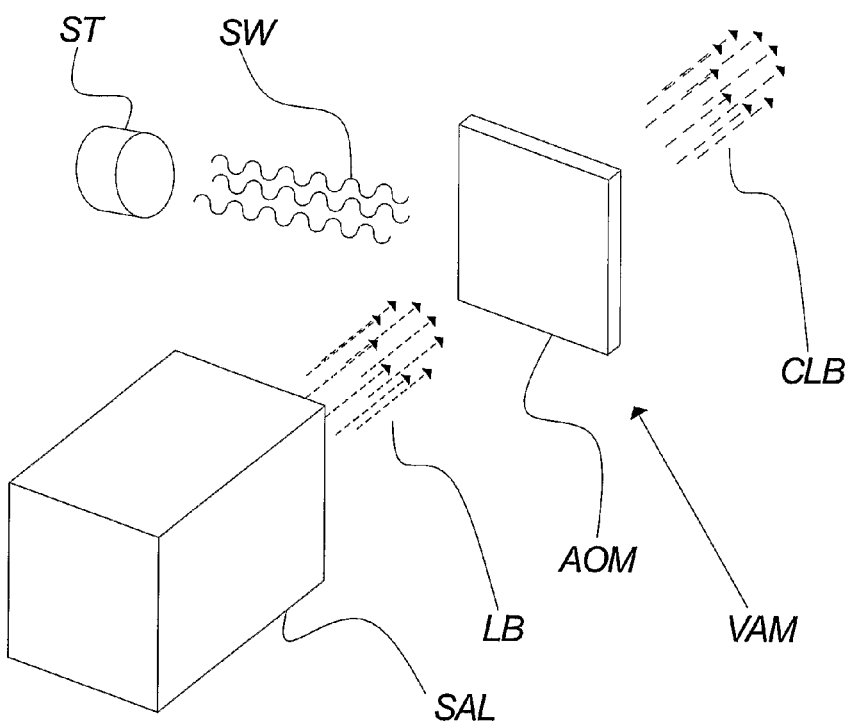
Figure 13:
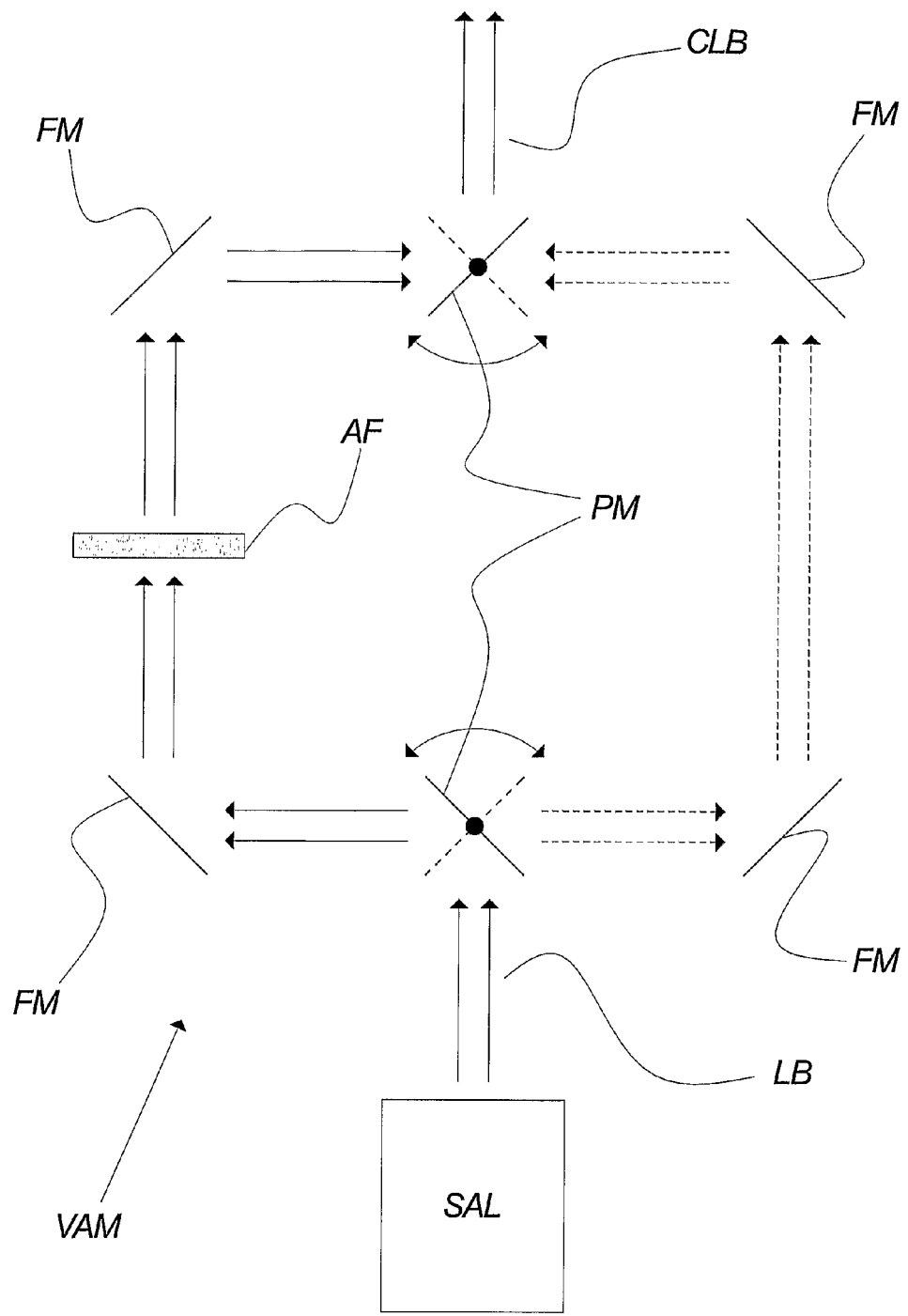
Figure 14:
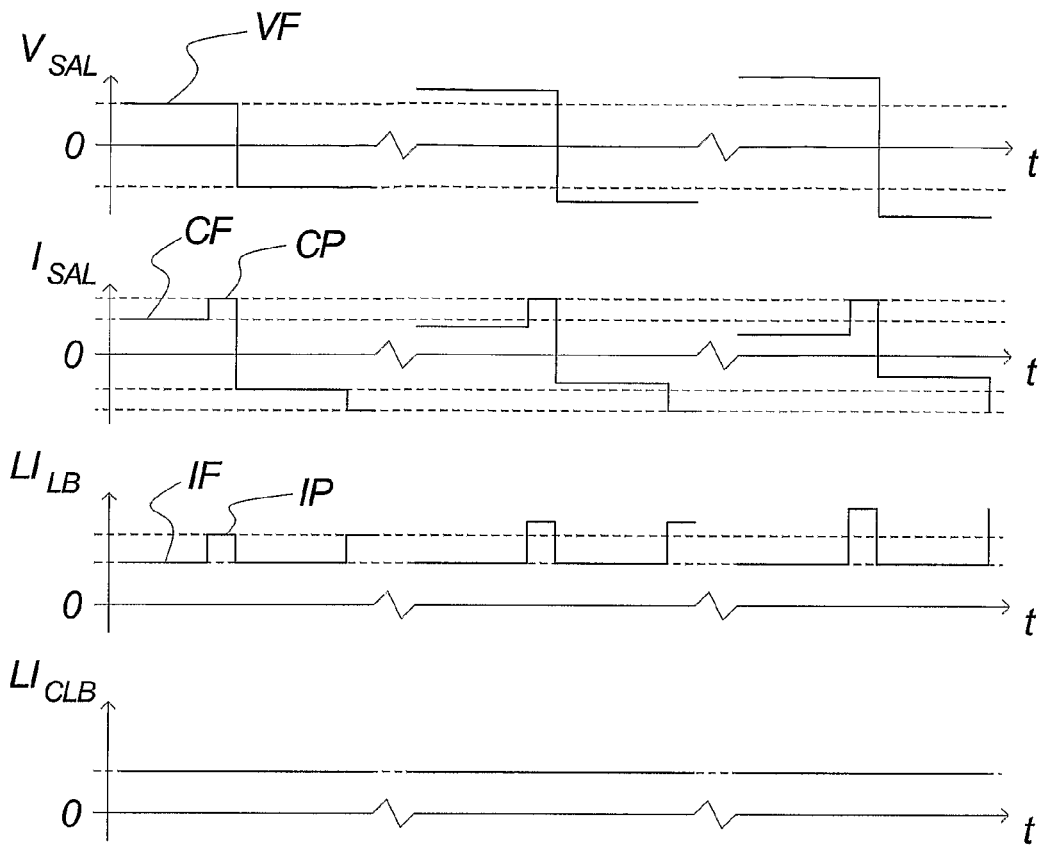
Figure 15:
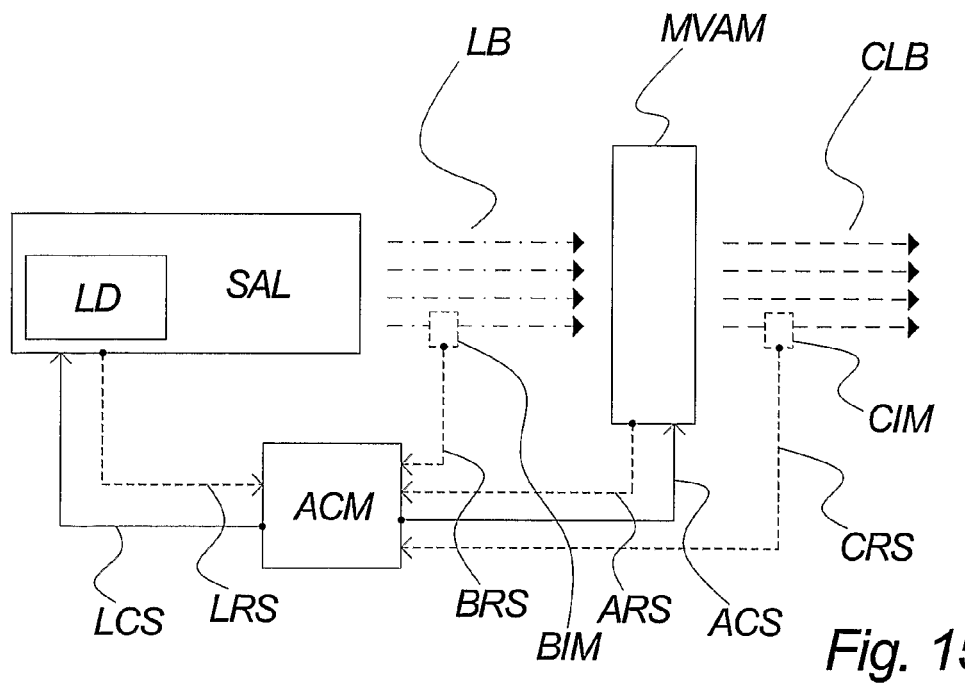
Figure 16:
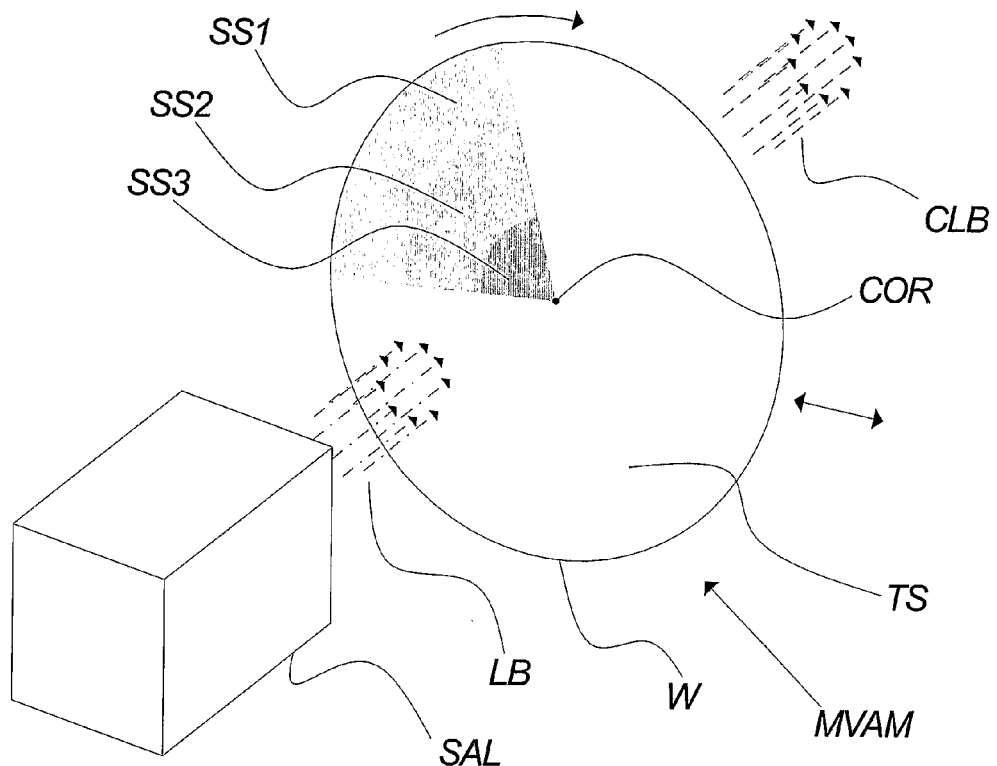
Figure 17:
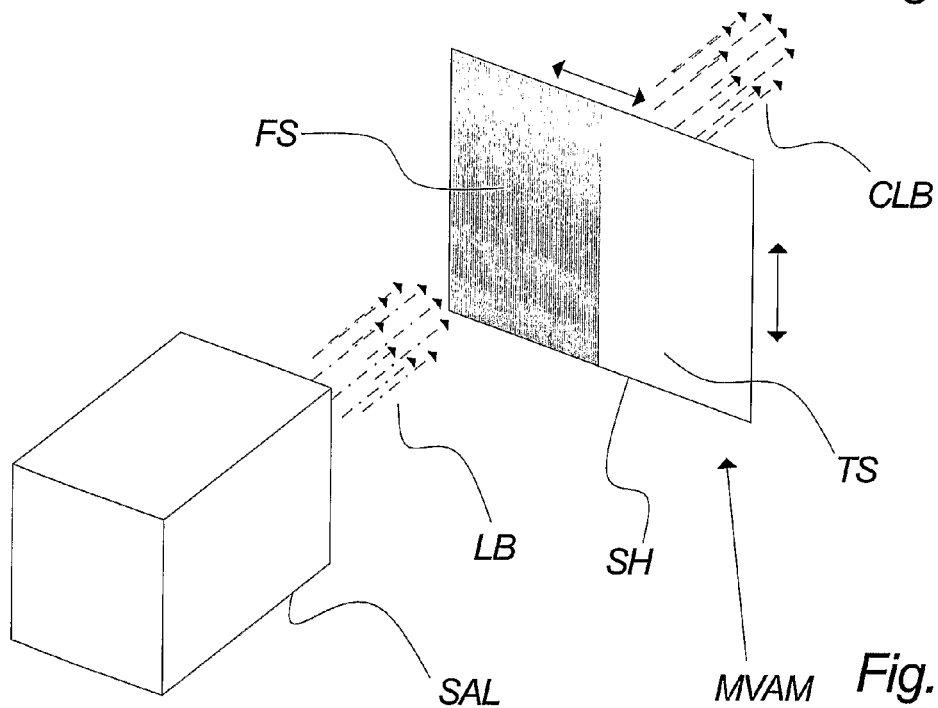
Figure 18:
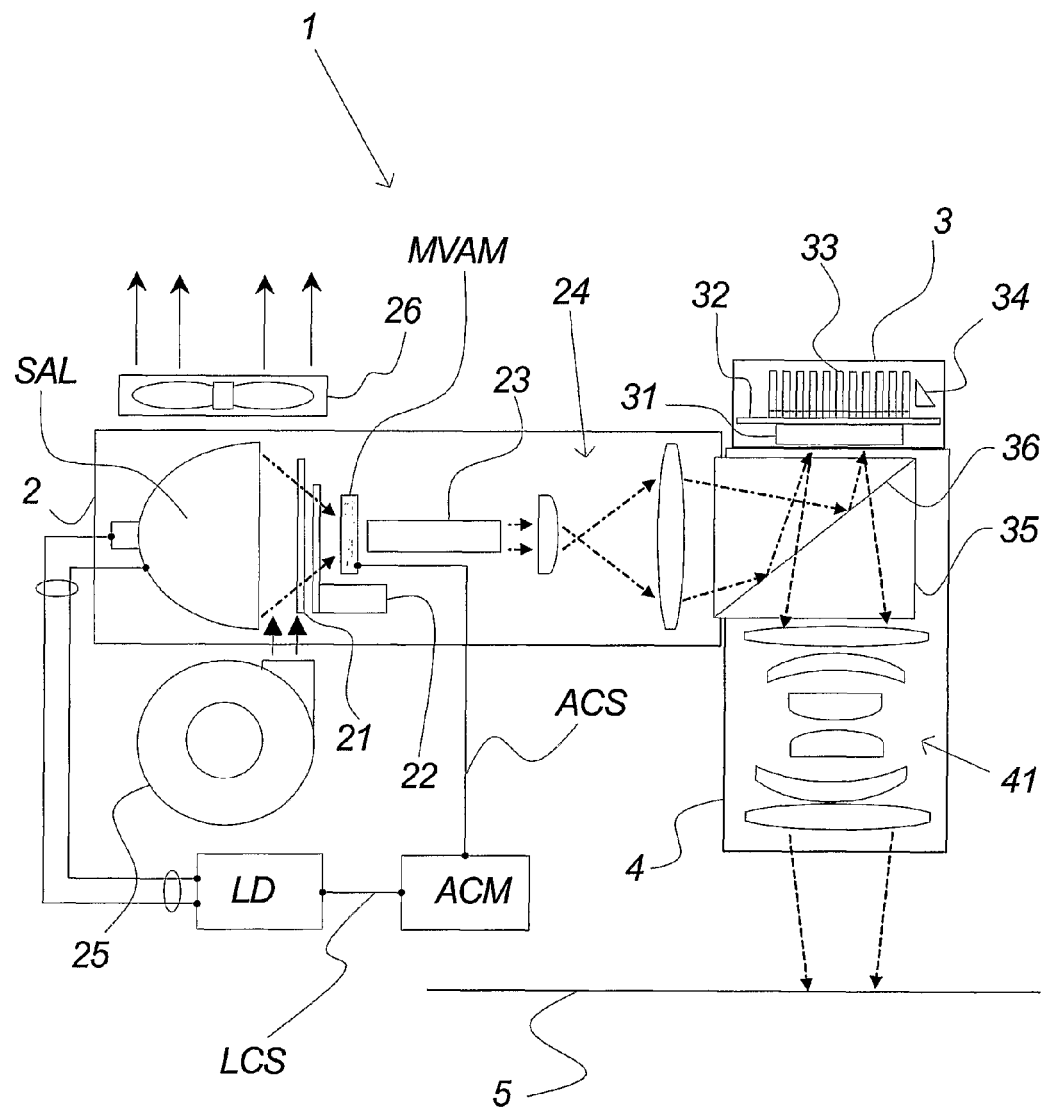

The invention will in the following be described with reference to the drawings where FIG. 1 illustrates a conceptual embodiment of the present invention, FIG. 2 illustrates timing diagrams illustrating current peaking, FIG. 3 illustrates an embodiment of a variable attenuation means VAM according to the present invention, FIG. 4 illustrates a further embodiment of a VAM comprising a semi-transparent wheel, FIG. 5 illustrates a further embodiment of a VAM comprising a semi-transparent wheel, FIG. 6 illustrates a further embodiment of a VAM comprising a semi-transparent wheel, FIG. 7 illustrates a further embodiment of a VAM comprising a diaphragm, FIG. 8 illustrates a further embodiment of a VAM comprising an opaque plate, FIG. 9 illustrates a further embodiment of a VAM comprising an opaque plate, FIG. 10 illustrates a further embodiment of a VAM comprising a semi-transparent sheet, FIG. 11 illustrates a further embodiment of a VAM comprising a spatial light modulator, FIG. 12 illustrates a further embodiment of a VAM comprising an acousto-optic modulator, FIG. 13 illustrates a further embodiment of a VAM comprising pivotally mounted mirrors, FIG. 14 illustrates timing diagrams illustrating changes during use, FIG. 15 illustrates a further conceptual embodiment of the present invention, FIG. 16 illustrates an embodiment of a multi-level variable attenuation means MVAM according to the present invention, FIG. 17 illustrates a further embodiment of an MVAM comprising a semi-transparent sheet, and FIG. 18 illustrates an embodiment of the present invention implemented for use in a light modulating arrangement.

DETAILED DESCRIPTION

FIG. 1 shows a block diagram of an embodiment of the present invention. It comprises a light source SAL that establishes a light beam LB and is powered by a lamp driver LD. A variable attenuation means VAM is inserted into the light beam LB in order to stabilize the luminous intensity and thus moderating it into a substantially constant intensity light beam CLB. An attenuation control means ACM controls the variable attenuation means VAM through an attenuation control signal ACS. In a preferred embodiment of the invention, the attenuation control means ACM further controls peaking of the lamp driver LD through a lamp driver control signal LCS. In more advanced or alternative embodiments of the present invention, the attenuation control means ACM may further receive an attenuation reference signal ARS from the variable attenuation means VAM, a lamp driver reference signal LRS from the lamp driver LD, a light beam reference signal BRS from a luminous intensity measuring device BIM placed in the path of the light beam, and/or a constant light beam reference signal CRS from a luminous intensity measuring device CIM placed in the path of the substantially constant intensity light beam.

The light source is preferably a short arc lamp, i.e., a high-pressure discharge lamp, and will in the following be treated as such even though it, within the scope of the present invention, may be any light-emitting device comprising, e.g., incandescent lamps of any type, fluorescent lamps, light emitting diodes (LEDs), laser emitters, etc. The short arc lamp may be of any type, e.g., metal halide lamps, mercury vapor lamps or sodium vapor lamps, etc. and is preferably an alternating current (AC) lamp but may as well within the scope of the invention be a direct current (DC) lamp or a lamp with more sophisticated power requirements. The light source is preferably provided with one or more reflectors or other light direction means in order to establish a light beam LB with as high luminous intensity as possible.

The lamp driver LD may be any kind of power supply suited to drive the particular light source. In the case of a short arc lamp as a light source, the lamp driver LD preferably establishes an alternating current (AC) with peaking in order to extend the lifetime of the lamp and stabilize the arc's position. Alternatively for a suitable short arc lamp, the lamp driver LD may establish a direct current (DC) with peaking or otherwise varying currency or voltage, e.g., saw-tooth shaped. The lamp driver LD is preferably a current source, but may as well within the scope of the invention be a voltage source.

FIG. 2 comprises timing diagrams of the voltage VSAL and current ISAL that in one embodiment of the invention is applied to the light source SAL. In the shown example, the lamp driver establishes an alternating current with peaking. The lamp driver outputs an alternating current ISAL which in addition to a positive and negative current floor CF value comprises current peaks CP prior to each direction shift. The voltage VSAL over the lamp alternates in the shown example between a positive and a negative voltage floor VF value. Both the voltage and the current waveforms are preferably square waves to ensure only very short periods of voltages in the region of the ground potential, usually 0V. Because of the current peaks CP the electrical power consumed by the light source will not be constant as the power may be evaluated as the product of the RMS current and the RMS voltage.

Examples of actual values in the case of a short arc lamp driven by AC with peaking, may comprise a voltage floor VF of e.g. 77-140 volts, a current floor CF of, e.g., 1.7-3.3 amperes, current peaks CP of e.g. 150-200% of the current floor CF value, a VSAL period time of e.g. 3-10 ms, and current peaks CP having a duration of, e.g., 200-600 J. s. It is noted that the present invention is in no way restricted to the values, waveforms, etc., mentioned above, as it in fact may be adapted to any magnitude- and timing scheme as the timing is either controlled by the attenuation control means ACM or accessible by means of a lamp driver reference signal LRS, a luminous intensity measuring device positioned in the light beam LB, the substantially constant intensity light beam CLB or both, etc. An often-used alternative timing scheme for short arc lamps is a direct current scheme with saw-tooth shaped current.

It is well known within the art that applying current peaks to a short arc lamp significantly improves its usability within precision applications, as the position of the arc becomes less fluctuating and thereby also the point of light emission.

FIG. 2 further illustrates the resulting luminous intensity LILB of the light beam LB.

As the luminous intensity is derived from the consumed electrical power, it comprises an intensity floor IF being proportional with the multiple of the voltage floor VF and the current floor CF and intensity peaks IP inherited from the current peaks CP having a value proportional with the multiple of the voltage floor VF and the current peak CP. The intensity peaks IP are thus a trade off for improved precision but are nevertheless unacceptable in many applications where a substantially constant luminous intensity is necessary. The last diagram of FIG. 2, thus, shows the desired waveform of the luminous intensity LICLB of a substantially constant intensity light beam CLB derived from the light beam LB by means of variable attenuation means VAM and attenuation control means ACM of the present invention.

The diagram of $LI_{LB}$ clearly illustrates one problem that the present invention may address. As the luminous intensity of the light beam LB comprises intensity peaks IP, any area exposed to the light beam LB will experience inconstant illumination. While this may be acceptable for some applications, e.g., projectors where the light beam is used to illuminate the same area continuously, it is not acceptable for applications within several areas as, e.g., photolithography and other techniques where the region to be exposed is only illuminated little by little. This is because the human eye is better to judge the relative intensities of, e.g., two dots established individually and presented side by side than intensity changes of one dot. Additionally, the periodicity of the intensity peaks may in unfortunate incidents cause stripes or other visible periodical patterns to occur.

One object of the variable attenuation means VAM is thus to absorb or otherwise reject the additional luminous intensity that occurs at the peaking times so that the luminous intensity becomes substantially constant, thus establishing a substantially constant intensity light beam CLB.

FIGS. 3 to 13 illustrate different possible embodiments of variable attenuation means VAM according to the present invention. It is noted that any other light attenuation techniques and any variations of the disclosed embodiments are within the scope of the present invention. In all the FIGS. 3 to 13, a light source SAL is illustrated, preferably a short arc lamp and preferably comprising reflection means or other light direction means. The light source SAL establishes a light beam LB that is directed against a variable attenuation means VAM, which moderates the light beam LB into a light beam with substantially constant luminous intensity CLB.

Although the light beams LB, CLB are shown to be conducted along a straight line through the air, it is noted that any means for light conducting, e.g., optical fibers, gasses, transparent material such as glass, light integrating rods, etc., may be applied, e.g., in order to avoid external disturbances, to conduct the light along curved paths, to position the light beam more precisely, to distribute the light more uniformly, to enable relative motion, e.g., due to vibration, between a light emitter and its intended receiver, etc.

All variable attenuation means embodiments described here require actuators, motors, controllers, electronic control or regulation circuits, or other driving means in order to operate. Such devices are due to clarity and the numerous available varieties are not shown but their types and operation modes may be assumed from the description. Furthermore, the variable attenuation means VAM require a control signal ACS from an attenuation control means ACM, illustrated in FIG. 1, or alternatively to output a reference signal ARS to an attenuation control means ACM. Such couplings are not illustrated in FIGS. 3 to 13. The features of the attenuation control means ACM are described afterwards.

The variable attenuation means VAM of FIG. 3 comprises a wheel W having a transparent section TS and a shaded section SS. The wheel may, e.g., be made of glass, Plexiglas or any other more or less transparent material. The shaded section SS may be made semi-transparent by applying a through-coloring or surface-coloring to a section of the wheel, e.g., by applying a semi-transparent film, by coating, etc. Any other method of establishing a wheel having a transparent section and a shaded, yet semi-transparent, section is within the scope of the present invention.

The wheel is rotating with a center of rotation COR being the center of the wheel. The center of rotation COR is displaced perpendicularly to the direction of the light beam LB, thus ensuring that the light never falls on different sides of the center of rotation at the same time. As the wheel W rotates, the light beam LB will, in the shown embodiment, most of the time go through a transparent section TS, but during a particular part of the time go through the shaded section SS and thereby undergo an attenuation according to the properties of the shading. The particular part of the time when the light beam falls through the shaded section may depend on properties such as the size and shape of the shaded section compared to the whole wheel and the location of the center of rotation compared to the spot where the light beam falls through.

By synchronizing the rotational speed of the wheel with any periodic changes in the luminous intensity of the light beam LB and adapting the opacity of the shaded section according to the intensity difference, it is possible to achieve an appropriate attenuation of the intensity peaks IP and thus establish a light beam with substantially constant luminous intensity CLB. Alternatively, the variable attenuation means VAM may output a reference of the rotational speed of the wheel to the attenuation control means ACM, which may in turn cause the lamp driver LD to be synchronized with the wheel.

Alternative embodiments of the attenuation means of FIG. 3 comprise, e.g., a wheel with several shaded sections positioned uniformly or asymmetrically around the wheel, a wheel with one or more shaded sections having other shapes than a triangle, etc.

FIG. 4 illustrates a variable attenuation means VAM similar to that of FIG. 3. In order to achieve as little intensity loss as possible, the transparent section of the wheel of FIG. 3 has been cut out, forming a cutout section CS in the wheel of FIG. 4. All other notes and alternatives to the embodiment in FIG. 3 apply to the present embodiment as well.

By synchronizing the rotational speed of the wheel with any periodic changes in the luminous intensity of the light beam LB and adapting the opacity of the shaded section according to the intensity difference, it is possible to achieve an appropriate attenuation of the intensity peaks IP and thus establish a light beam with substantially constant luminous intensity CLB.

Alternatively, the variable attenuation means VAM may output a reference of the rotational speed of the wheel to the attenuation control means ACM, which may in turn cause the lamp driver LD to be synchronized with the wheel.

FIG. 5 illustrates a further wheel-based embodiment of a variable attenuation means VAM. It comprises a rotating wheel W with a center of rotation COR. The surface of the wheel comprises a raster section RS scattered with opaque dots and a transparent section TS. The dots of the raster section RS may be distributed uniformly, symmetrically, randomly or according to any suitable pattern and may be of any kind, form and size, e.g., round, square, ruled, etc. The technique used to establish the dots is not important and may, thus, be any possible method, e.g., painting, printing, applying a pre-printed film, etching, using a photographic technique, etc. The raster dots may alternatively be established by removing opaque material from a fully opaque section. The bigger the part of the raster section RS that is made opaque by dots, the more is the luminous intensity of the light beam LB attenuated.

Alternative embodiments of the attenuation means of FIG. 5 comprise e.g., a wheel with several raster sections positioned uniformly or asymmetrically around the wheel, a wheel with one or more raster sections having other shapes than a triangle, etc.

By synchronizing the rotational speed of the wheel with any periodic changes in the luminous intensity of the light beam LB and adapting the average opacity of the raster section RS according to the intensity difference, it is possible to achieve an appropriate attenuation of the intensity peaks IP and thus establish a light beam with substantially constant luminous intensity CLB. Alternatively, the variable attenuation means VAM may output a reference of the rotational speed of the wheel to the attenuation control means ACM, which may in turn cause the lamp driver LD to be synchronized with the wheel.

FIG. 6 illustrates a yet further wheel-based embodiment of a variable attenuation means VAM. It comprises a wheel W with an at least partly opaque surface rotating around a center of rotation COR. The surface of the wheel comprises a perforated section PS and a cutout section CS. Thus, the least attenuating light path is ensured at times where the light beam LB falls on the non-attenuating section of the wheel W. The perforations of the perforated section PS may be any kind, form and size of holes, e.g., round, square, ruled, etc., and may be established by any perforation method. The bigger the part of the perforated section PS that is made transparent by perforations, the less the luminous intensity of the light beam LB is attenuated.

The perforations of the perforated section PS may be any kind, form and size of holes, e.g. round, square, ruled, etc., and may be established by any perforation method. The bigger the part of the perforated section PS that is made transparent by perforations, the less the luminous intensity of the light beam LB is attenuated.

Alternative embodiments of the attenuation means of FIG. 6 comprise, e.g., a wheel with several perforated sections positioned uniformly or asymmetrically around the wheel, a wheel with one or more perforated sections having other shapes than a triangle, etc.

By synchronizing the rotational speed of the wheel with any periodic changes in the luminous intensity of the light beam LB and adapting the average opacity of the perforated section PS according to the intensity difference, it is possible to achieve an appropriate attenuation of the intensity peaks IP and thus establish a light beam with substantially constant luminous intensity CLB. Alternatively, the variable attenuation means VAM may output a reference of the rotational speed of the wheel to the attenuation control means ACM, which may in turn cause the lamp driver LD to be synchronized with the wheel.

FIG. 7 illustrates a variable attenuation means VAM in the form of a diaphragm DP. By means of a number of lamellae LM, an aperture AP of variable size is established. The dashed lines indicate an alternative setting of the lamellae LM causing an enlarged aperture AP. By establishing an aperture AP wider than the width of the light beam LB, it is possible to let through the full luminous intensity of the light beam LB. When the luminous intensity of the light beam LB increases, the aperture may be reduced in order to maintain a substantially constant luminous intensity of the constant intensity light beam CLB. It is noted that any diaphragm technique is within the scope of the present invention comprising, e.g., lamellae of different shapes, e.g., having curved shapes, apertures of different shapes, e.g., semicircular or trapezoidal, different operation modes, different actuation modes, etc.

By synchronizing changes of the aperture size of the diaphragm with any periodic changes in the luminous intensity of the light beam LB and controlling the aperture size according to the intensity difference, it is possible to achieve an appropriate attenuation of the intensity peaks IP and thus establish a light beam with substantially constant luminous intensity CLB. Alternatively, the variable attenuation means VAM may output a reference of aperture size changes of the diaphragm to the attenuation control means ACM, which may in turn cause the lamp driver LD to be synchronized with the diaphragm.

FIG. 8 illustrates a variable attenuation means VAM in the form of an opaque plate OP being fitted at the end of an arm AR that may be placed fully, partially or not in the path of the light beam LB by rotating it around a center of rotation COR positioned at the opposite end of the arm AR. The percentage of the light beam being obstructed by the opaque plate OP then determines the attenuation. The variable attenuation means embodiment of FIG. 8 is merely for illustrating an attenuation method and it is obvious that any form of the opaque plate OP, any placement of the center of rotation COR, any connection means there between, e.g., an arm AR, any alternatives to rotation, e.g., sliding the opaque plate into the light beam in a horizontal or vertical movement as opposed to rotational movement or any other methods of partially obstructing a light beam are within the scope of the present invention.

By synchronizing a partial insertion of the opaque plate into the light beam LB with any periodic changes in the luminous intensity of the light beam and adapting the degree of insertion of the opaque plate according to the intensity difference, it is possible to achieve an appropriate attenuation of the intensity peaks IP and thus establish a light beam with substantially constant luminous intensity CLB.

Alternatively, the variable attenuation means VAM may output a reference of the insertion times or degree of insertion of the opaque plate to the attenuation control means ACM, which may in turn cause the lamp driver LD to be synchronized with the variable attenuation means.

FIG. 9 illustrates an alternative variable attenuation technique utilizing an opaque plate OP. It comprises an opaque plate OP mounted on an arm AR. The plate may obstruct the light beam in different degrees according to its rotation around an axis of rotation AOR, preferably an elongation of the arm AR. When the opaque plate OP is rotated to a position where the plate surface is parallel to the light beam, a minimum obstruction is achieved. In any other rotational state, the opaque plate obstructs the light beam at least partially and completely at least at the position where the surface of the plate is perpendicular to the light beam. The luminous intensity attenuation may be determined from the rotation angle, the size of the plate, and the cross-sectional diameter of the light beam. Obviously, the alternatives mentioned for the embodiment of FIG. 8 also apply to the present embodiment. Moreover, it applies to both the embodiments of FIG. 8 and FIG. 9 that a semi-transparent, perforated or dotted plate may be used instead of a completely opaque plate in order to achieve a certain amount of control over the applied attenuation.

By synchronizing the rotation of the opaque plate with any periodic changes in the luminous intensity of the light beam LB and adapting the degree of rotation of the opaque plate according to the intensity difference, it is possible to achieve an appropriate attenuation of the intensity peaks IP and thus establish a light beam with substantially constant luminous intensity CLB. Alternatively, the variable attenuation means VAM may output a reference of the degree of rotation of the opaque plate to the attenuation control means ACM, which may in turn cause the lamp driver LD to be synchronized with the variable attenuation means.

An alternative embodiment of a variable attenuation means VAM is illustrated in FIG. 10. It comprises a sheet SH, the surface of which comprises a transparent section TS and a shaded section SS. One section or the other may be moved into the light beam LB by horizontal motion. The kind of shading of the shaded section SS determines the degree of attenuation done to the light beam LB when the shaded section is placed in the light beam path. It is noted that the shown embodiment merely illustrates a principle of operation and that any variations of the present embodiment, e.g., according to any attributes of the other embodiments shown above, are within the scope of the present invention. Such variations may, e.g., comprise perforating or dotting a section instead of shading it, cutting out a section instead of using transparent material, alternative shapes of the sheet, alternative positioning of the different sections in relation to each other, establishing more shaded sections, adjusting the attenuation by other kinds of motion, e.g., vertically or rotationally, etc.

By synchronizing the times of inserting the shaded section into the light beam LB with any periodic changes in the luminous intensity of the light beam and adapting the opacity of the shaded section according to the intensity difference, it is possible to achieve an appropriate attenuation of the intensity peaks IP and thus establish a light beam with substantially constant luminous intensity CLB. Alternatively, the variable attenuation means VAM may output a reference of the insertion times of the shaded section to the attenuation control means ACM, which may in turn cause the lamp driver LD to be synchronized with the variable attenuation means.

Common to all the above-described variable attenuation means embodiments are that they are relatively large-scope devices requiring relatively large wheels or plates to be positioned accurately in order to obtain a desired attenuation. As the intensity peaks IP appear and disappear instantly, a corresponding change in attenuation should be established correspondingly fast. This may be a disadvantage for the above-mentioned embodiments as they all change their attenuation factor little by little instead of instantly because of the light beam having a cross-sectional extent.

Thus, the timing diagram of the luminous intensity of a realistic substantially constant intensity light beam LICLB of FIG. 2 would comprise small variations at the positions of the edges of the intensity peaks IP. To overcome this, the mechanical change from non-attenuation to attenuation could be made faster by, e.g., increasing the rotational speed of the wheel, thus, however, requiring the size of the wheel to be dramatically increased or the intensity peak frequency could be decreased.

Advantages of the above-described embodiments comprise cost and the possibility of applying any kind or variations of filters, e.g., polarization filters, IR-filters, white color point balancing filters, etc. Furthermore, it is possible to establish a variable attenuation means VAM that has equal attenuation and non-attenuation for all relevant wavelengths, thus avoiding any other disturbance of the light beam than the removal of the intensity peaks IP.

FIG. 11 illustrates an embodiment of a variable attenuation means VAM comprising a spatial light modulator SLM. Spatial light modulators comprise, e.g., electro-optic, magneto-optic or acousto-optic material. The spatial light modulator SLM shown is of a transmissive type, where the incident light is conducted through the spatial light modulator according to the current properties of the modulator. Such modulators comprise, e.g., liquid crystal display (LCD) modulators, liquid crystal light valves (LCLV), micro-mechanical shutters, etc. Other types of spatial light modulators may be used as well, e.g., modulators where the incident light beam is reflected, such as, e.g., digital micro mirror devices (DMD), grating light valves (GLV), deformable mirror devices, etc.

Most spatial light modulators comprise numerous, e.g., many hundreds of thousands or even millions of individually controllable pixels CP, OP, which may be either closed CP or open OP. In the case of a transmissive modulator, an open pixel OP is transparent and a closed pixel CP is opaque to the light beam LB. By opening all pixels, the highest possible luminous intensity is conducted through the modulator and by closing all pixels, the least possible luminous intensity is conducted through. By closing only a part of the pixels, a degree of attenuation has been achieved, which is variable by changing the number of closed pixels. The pixels that are closed may be distributed uniformly over the surface or according to some pattern.

By closing only a part of the pixels, a degree of attenuation has been achieved, which is variable by changing the number of closed pixels. The pixels that are closed may be distributed uniformly over the surface or according to some pattern.

By synchronizing the closing and opening of pixels with any periodic changes in the luminous intensity of the light beam LB and adapting the number and positions of pixels that may be closed according to the intensity difference, it is possible to achieve an appropriate attenuation of the intensity peaks IP and thus establish a light beam with substantially constant luminous intensity CLB. Alternatively, the variable attenuation means VAM may output a reference of the closing times and/or the number and positions of the closed pixels to the attenuation control means ACM, which may in turn cause the lamp driver LD to be synchronized with the spatial light modulator.

FIG. 12 illustrates an embodiment of a variable attenuation means VAM comprising a spatial light modulator SLM being an acousto-optic modulator AOM. The embodiment further comprises a sound transmitter ST transmitting sound waves SW in the direction of the acousto-optic modulator AOM. Properties of an acousto-optic material, e.g., a Bragg cell, comprise the possibility of changing its optical properties by applying acoustic energy to it. It is, thus, possible to control the attenuation of a light beam by controlling the acoustic energy delivered to the acousto-optic modulator AOM.

By synchronizing the transmission of sound waves with any periodic changes in the luminous intensity of the light beam LB and adapting the sound waves so that the opacity of the acousto-optic modulator correspond to the intensity difference, it is possible to achieve an appropriate attenuation of the intensity peaks IP and thus establish a light beam with substantially constant luminous intensity CLB.

Alternatively, the variable attenuation means VAM may output a reference of the current opacity of the acousto-optic modulator or the times of sound transmission, etc., to the attenuation control means ACM, which may in turn cause the lamp driver LD to be synchronized with the acousto-optic modulator.

Common to the variable attenuation means embodiments of FIGS. 11 and 12 are that they have no mechanical parts or at least extremely small mechanical parts. This enables them to change their properties very fast, e.g., within nanoseconds, which is a great advantage when considering the instantly changing intensity peaks of the light beam LB. Moreover, they have, except for the micromechanical shutters, no mechanical parts that are worn and may break during use.

Disadvantages of the spatial light modulators, however, comprise relatively high costs, relatively high intensity losses even when completely open, and often very bad and uncontrollable rendering capabilities as to light properties such as wavelengths, polarization, etc.

FIG. 13 illustrates a further embodiment of a variable attenuation means VAM. It comprises a light source SAL, preferably a short arc lamp, which emits a light beam LB. The light beam falls on a pivotally mounted mirror PM that according to its position is able to reflect the light beam in two opposite directions indicated by the solid and the dashed lines. In either situation, the light beam is reflected 90 by a fixed mirror FM. Following the solid lines, the light beam is conducted through an attenuation filter AF and then reflected 90 by a fixed mirror FM. In the other case, the light beam is just reflected 90 by a fixed mirror FM. Eventually, the light beam hits a second pivotally mounted mirror PM and is reflected in the same direction as the initial light beam LB but is now a substantially constant intensity light beam CLB. The pivotally mounted mirrors PM should be synchronized with the edges of the intensity peaks IP in order to conduct all intensity peaks through the attenuation filter AF. It is noted that several variations may be made to the present embodiment, e.g., by repositioning the mirrors, adding more mirrors, turning some or all of the mirrors, using more advanced optical elements such as e.g., TIR-prisms, etc. Such variations are within the scope of the present invention, as well as any combinations of the above-described embodiments.

By synchronizing the setting of the pivotally mounted mirrors PM with any periodic changes in the luminous intensity of the light beam LB and adapting the opacity of the attenuation filter AF according to the intensity difference, it is possible to achieve an appropriate attenuation of the intensity peaks IP and, thus, establish a light beam with substantially constant luminous intensity CLB. Alternatively, the variable attenuation means VAM may output a reference of the setting of the pivotally mounted mirrors PM to the attenuation control means ACM, which may in turn cause the lamp driver LD to be synchronized with the variable attenuation means.

For all the variable attenuation means VAM of FIG. 3 to 13 it applies that any other shape of the wheel W, e.g., square, any combinations of the illustrated or mentioned techniques, any displacements of the centers of rotation COR, any technical additions in the form of, e.g., optical fibers, light guides, mirrors, etc. to control the positioning of the light beam, optical elements such as lenses, light-integrating rods or triangles, TIR-prisms, to control the composition and focusing of the light beam, electronical and mechanical devices to control or drive the variable attenuation means, e.g., LCD-drivers, etc., any combinations of the variable attenuation means with other light filtering means, e.g., a color wheel, etc., are within the scope of the present invention.

As indicated above, the attenuation control means ACM should ensure synchronization between the timing and magnitude of the intensity peaks IP and the timing and degree of attenuation carried out by the variable attenuation means VAM, in such a way that intensity peaks IP or other events of additional intensity are cancelled by attenuating them in a degree making their intensity equal to the intensity floor IF.

Preferably, the attenuation control means ACM is in control of both the lamp driver LD and the variable attenuation means VAM by control signals LCS and ACS. Thereby, the attenuation control means ACM is able to establish a timing and magnitude scheme that suites the requirements of the light source SAL and exploits the features of the variable attenuation means VAM in the best possible way. For example, when the variable attenuation means VAM is comprised of a wheel W comprising a shaded section SS and a transparent section TS as illustrated in FIG. 3, the rotational speed of the wheel is probably controllable, whereas the size of the shaded section SS is not. A strong correspondence between the duration of attenuation, i.e., the shaded section is located in the light beam and the frequency of attenuation, i.e., the wheel revolutions per second, thus exists. Furthermore, the attenuation applied by the shaded section is constant. When the attenuation control means ACM has full control over the lamp driver LD it may thus either set a high peak frequency with relatively short peak durations or a low peak frequency with relatively long peak durations and furthermore control the magnitude of the intensity peaks to conform to the attenuation of the shaded section. When, on the other hand, the variable attenuation means VAM is, e.g., comprised of a spatial light modulator of an LCD type, the restrictions on frequency and duration are very small, and any degree of attenuation may be applied. Thus, the attenuation control means ACM may be adapted to better suit what is in the best interest for the lamp driver and light source such as peak frequencies, peak durations and peak magnitude.

The attenuation control means ACM is preferably an electronic device but may alternatively, according to the type of lamp driver and variable control means, be completely or partially mechanical or of any other suitable category or combination of categories. The attenuation control means ACM may be a separate device or it may be integrated into the variable attenuation means VAM or the lamp driver LD.

In a simple embodiment, control properties of the attenuation control means ACM are set by the manufacturer or the user, according to predefined schemes, probably related to the intended kinds of light source, lamp driver and variable attenuation means VAM.

In an alternative embodiment, the attenuation control means ACM reads a lamp driver reference signal LRS, e.g., comprising information on the intensity peak timing and uses that for synchronizing the variable attenuation means VAM thereto, e.g., wheel rotation speed, pixel closing times, aperture size, etc., according to its operation mode. Alternatively, some of the lamp drivers' properties are controllable, e.g., when to establish a current peak, and others are not, e.g., the duration of a current peak. In such applications, both a lamp driver reference signal LRS and a lamp driver control signal LCS may be used. The information to transmit to the attenuation control means ACM via the lamp driver reference signal LRS may be established in any suitable way, e.g., by coupling the reference signal to the light source power cord, by measuring voltages and/or currents in the lamp driver and/or light source, by adapting the lamp driver to provide such information, etc.

In a further alternative embodiment, the attenuation control means ACM reads an attenuation means reference signal ARS, e.g., comprising information on the current degree of attenuation, the timing of the attenuation level changes, etc., and uses that for synchronizing the lamp driver LD thereto, e.g., intensity peak timing, duration, etc. Alternatively, some of the variable attenuation means' properties are controllable, e.g., the rotational speed of the wheel, and others are not, e.g., the duration of the attenuation, i.e., the size of the shaded section. In such application, both an attenuation means reference signal ARS and an attenuation control signal ACS may be used. The information to transmit to the attenuation control means ACM via the attenuation means reference signal ARS may be established in any suitable way, e.g., by measuring voltages, currents and/or magnetic fields in any driver, actuator or other electronical part of the variable attenuation means, by currently measuring the degree of attenuation or the absence or presence of attenuation, by adapting the variable attenuation means to provide such information, e.g., by adding revolution counters, frequency meters, angle gauges or other transducers or meters, etc.

In a further alternative embodiment, the attenuation control means ACM reads a light beam reference signal BRS and/or a constant light beam reference signal CRS. Such signals may be established by means of intensity measuring devices BIM, CIM, placed in the paths of the light beam LB and the constant intensity light beam CLB, respectively. Preferably, the light intensity measuring devices are small relative to the cross-sectional area of the light beams and are placed in the periphery of the light beams in order to minimize the interruption of the light beams. Alternatively, the intensity measuring devices BIM, CIM may be placed outside the light beams and small mirrors or other light directing devices may be placed in the light beams to conduct a fraction of the light towards the intensity measuring devices. If only a light beam reference signal BRS is available, the attenuation control means ACM may use this for determining the timing of intensity peaks IP. If only a constant light beam reference signal CRS is available, the attenuation control means may process this by means of common feedback techniques and, thus, regulate the lamp driver or variable attenuation means adaptively as the reading from that signal should be constant. If both signals are available, the attenuation control means ACM may subtract the signals from each other and thereby determine the timing of the variable attenuation means VAM.

Further alternative embodiments comprise any combinations of the above-described embodiments and are within the scope of the present invention. A preferred advantageous embodiment is obtained by combining the use of a constant light beam reference signal CRS with an attenuation reference signal ARS, thereby enabling adaptive control of the lamp driver and variable attenuation means VAM.

Most light sources, and especially short arc lamps, change over time with regard to, e.g., power consumption, output intensity, stability, heat dissipation, etc. Any of such changes that may influence the luminous intensity of the light beam LB are important in the present context as they render the act of compensating for inconstant luminous intensity even more difficult. When discussing short arc lamps, the problem with changes over time is particularly obvious when the light source is driven with peaking, whether AC or DC.

FIG. 14 is provided to better explain the problem in the context of a short arc lamp driven by AC with peaking. The timing diagram of FIG. 14 corresponds in many ways to the timing diagram of FIG. 2, yet the time axes, however, have been extended far beyond those of FIG. 2. The far longer time period is indicated by the breaks on each time axis. Each break corresponds to several hours, e.g., 200 hours.

The first diagram illustrates the voltage VSAL over the light source SAL. It is a square waveform as in FIG. 2 but the voltage floor VF increases with time of use. This is caused by the electrode gap of the short arc lamp slowly growing wider during use because of displacement of electrode material. A wider gap necessitates a higher voltage in order for the electrons to jump the gap and, thus, establishes the light-emitting arc.

As the power consumed by the light source should be substantially fixed in order for the luminous intensity of the light beam to be constant, an increase in voltage forces the current to decrease inverse proportionally as the power is determined by the multiple of the voltage and the current. The second diagram of FIG. 14 shows three snapshots of the light source current ISAL at different times during use. It is seen that the current floor CF decreases as the voltage floor increases. The current peaks CP are, however, maintained at a constant value, as the lamp driver LD rather than the power dissipation of the light source SAL determines that specific value.

The third diagram of FIG. 14 illustrates the luminous intensity of the light beam LILB established by the light source on the basis of the voltage and current schemes of FIG. 14. As the luminous intensity is proportional with the electrical power, the intensity is maintained at a constant level indicated by the intensity floor IF, whereas the intensity of the intensity peaks IP increases due to its correspondence with the multiplication of an increasing voltage with a constant current.

The fourth diagram of FIG. 14 illustrates the desired luminous intensity of a light beam having substantially constant luminous intensity LIcLB. As most of the variable attenuation means VAM embodiments previously described with reference to FIGS. 3 to 13 have only two levels of attenuation, i.e., preferably zero attenuation and a level according to the intensity increase at the intensity peaks when they are considered constant, they may not directly be used to address the problem of intensity peaks heightening during use.

One object of the present invention is to adapt the variable attenuation means VAM in order to enable it to compensate for real-time changes in the intensity level that it is meant to attenuate and, thus, facilitate establishment of a light beam with substantially constant luminous intensity CLB.

FIG. 15 illustrates a block diagram of an embodiment of the present invention. It comprises the blocks and couplings as the embodiment of FIG. 1, except for the variable attenuation means VAM, has been replaced with a multi-level variable attenuation means MVAM to address the problems of varying magnitude of the intensity peaks IP during use.

The multi-level variable attenuation means MVAM is able to apply more than two different levels of attenuation to the light beam LB in order to establish a substantially constant intensity light beam CLB at all times. The timing of the changing between being transparent and applying an attenuation should be controlled exactly as with the variable attenuation means VAM. But in addition to that, a control of which level of attenuation to apply at different times should be appended.

This control is preferably obtained by adapting the attenuation control means ACM.

Any of the variable attenuation means VAM described with reference to FIG. 3 to 13 may be modified into multi-level variable attenuation means MVAM. In the following, such possible modifications are described with reference to FIGS. 3 to 13 and FIGS. 16 and 17.

The embodiment of a variable attenuation means VAM of FIG. 3, i.e., a wheel comprising a shaded section SS and a transparent section TS, may be modified into a multi-level variable attenuation means MVAM as shown in FIG. 16. The embodiment of FIG. 16 comprises a light source SAL establishing a light beam LB that is conducted through a multi-level variable attenuation means MVAM and thereby moderated into a substantially constant light beam CLB. The multi-level variable attenuation means MVAM comprises a rotating wheel W with a center of rotation COR. The surface of the wheel W is parted into a transparent section TS and several shaded, yet semi-transparent, sections SS1, SS2, SS3. Each of the shaded sections has different levels of shading and may, thus, attenuate any light falling through it differently. The number of differently shaded sections is in no way limited to three and may be determined on the basis of the difference between the intensity levels the wheel should be able to attenuate and the desired precision. In an alternative embodiment only one shaded section exists, which, however, is colored in a way that makes it fade through different shades at different positions enabling it to apply infinite variable attenuation to the light beam. An example of that alternative may in principle be derived from FIG. 17.

The differently shaded sections are positioned on the wheel in such a way that any of them may be placed in the path of the light beam by displacing the wheel or the light beam in a direction perpendicular to the direction of the light beam. Thus, the wheel is able to quickly and with a precise periodicity change its opacity from transparent to a specific level by rotating around the center of rotation and more slowly and freely change that specific level to a different level. This conforms excellently to the nature of the intensity changes of the light beam, as the intensity peaks IP occur periodically and may be considered of equal magnitude within a particular time interval but may change during prolonged use.

The method of establishing a multi-level variable attenuation means MVAM from the wheel-based embodiment of FIG. 3 may be applied to any other wheel-based variable attenuation means embodiment, e.g., the embodiments of FIG. 4, 5 or 6. It is noted, as for the variable attenuation means VAM embodiments, that the number, size and shape of the shaded sections may be anything suitable, and is thus not limited to the one, triangular section shown in FIG. 16.

The diaphragm-based embodiment of a variable attenuation means VAM described above with reference to FIG. 7, may easily be applied as a multi-level variable attenuation means MVAM as it, within its physical possibilities, may establish any aperture size. In fact, it inevitably goes through several levels of attenuation when changing from being transparent to a certain level of attenuation.

The two embodiments based on shifting an opaque, or alternatively semitransparent, plate OP in and out of the light beam described with reference to FIGS. 8 and 9, may also easily be applied as multi-level variable attenuation means MVAM, as the degree of obstruction of the light beam may be freely chosen and this is what determines their level of attenuation. As with the diaphragm type, this embodiment also inevitably goes through several levels of attenuation when changing from no obstruction to a certain level of obstruction.

The embodiment of a variable attenuation means VAM described with reference to FIG. 10 may, e.g., be adapted into a multi-level variable attenuation means MVAM as illustrated in FIG. 17. This figure corresponds to FIG. 10 as it also comprises a light source SAL establishing a light beam LB that is moderated into a substantially constant intensity light beam CLB. In FIG. 17, the moderation is achieved by means of a multi-level variable attenuation means MVAM, which comprises a sheet SH having a transparent section TS and a fading section FS fading through different degrees of shading at different positions. By moving the sheet SH horizontally, perpendicular to the direction of the light beam, transparency or attenuation mode may be chosen. By moving the sheet vertically, perpendicular to the direction of the light beam, the level of attenuation may be chosen. The fading section is semi-transparent, but has different levels of opacity. The fading section may be established as described with reference to FIG. 3, 10 or 16, or it may rather be a raster section as described with reference to FIG. 5, a perforated section as described with reference to FIG. 6 or any other kind of semi-transparent section. The fading section FS may be substituted for several differently shaded sections, e.g., as may be derived in principle from FIG. 16. The fading section may have any kind of fading pattern, any shape, any size, etc. According to the positioning of the fading section and the transparent section, any suitable motion patterns may be applied.

The two spatial light modulator embodiments described with reference to FIGS. 11 and 12 and most other available spatial light modulator embodiments have an inherent character of being multi-level variable attenuation means MVAM, as the degree of attenuation of the light beam may be freely chosen among numerous combinations of, e.g., open and closed pixels. As the spatial light modulators offer changing from one level of attenuation to any other level very fast, precise, and without going through any undesired levels of attenuation in between, they are good choices when these are main issues. Furthermore, several pixel patterns are available for each level of attenuation, which makes it possible at least to some extent to compensate for a possible imbalanced intensity distribution over the cross section of the light beam LB.

The embodiment of a variable attenuation means VAM described above with reference to FIG. 13 may be adapted into a multi-level variable attenuation means MVAM by enhancing the attenuation filter AF. This may, e.g., be adapted to comprise several or infinite different grades of opacity and a method of choosing a specific grade, e.g., by vertical or horizontal motion as described with reference to FIG. 16 or 17. Alternatives comprise substituting the attenuation filter with a diaphragm with variable aperture, an opaque plate partially obstructing the light beam, a spatial light modulator, etc.

It is noted that any embodiment of a multi-level variable attenuation means MVAM suitable for moderating a light beam LB into a substantially constant intensity light beam CLB is within the scope of the present invention.

The different embodiments of variable attenuation means VAM and multi-level variable attenuation means MVAM disclosed in this document all have different advantages and disadvantages. The choice of embodiment for an actual application depends on a balancing between those advantages and disadvantages. An ideal embodiment of an attenuation means conforms to several requirements such as absolutely no attenuation or other disturbances of light properties when in transparent mode, absolutely no disturbance of light properties except for intensity when in attenuation mode, instant shift between transparent and attenuation modes, or at least within the rise time of the intensity peak IP, numerous or preferably infinite different attenuation levels, no unintentional change over time, possibility of monitoring their current state, not too expensive, limited spatial requirements etc.

Generally, the simple mechanical embodiments, i.e., wheel-types, diaphragms, opaque plates to be inserted in the light beam, etc., offer excellent transparency conditions as their transparent mode may just comprise an opening or a material with extreme transparency.

Furthermore, they may be made of relatively cheap components and several of them offer numerous or infinite attenuation levels. Disadvantages of the simple mechanical embodiments comprise a relatively slow shift between transparency and attenuation, which, furthermore, goes through several levels of attenuation before reaching the desired level and risk of property changes and even breakage over time due to wear.

The spatial light modulators, i.e., magneto-optic, electro-optic and acousto-optic modulators, etc., on the other hand, offer fast and precise shift between transparency and attenuation, numerous, practically infinite, attenuation levels and very small risk of breakage or changes due to wear but they often cause significant loss of intensity even when in transparency mode and they are expensive.

As described above, the attenuation control means ACM ensures synchronization between the timing and magnitude of the intensity peaks IP and the timing and degree of attenuation applied by the multi-level variable attenuation means MVAM in such a way that intensity peaks IP or other events of additional intensity are cancelled by attenuating them in a degree making their intensity equal to the intensity floor IF.

In a simple embodiment of the attenuation control means ACM, a user or manufacturer may change the control properties from time to time according to measurements of the intensity peak magnitudes or according to predefined schemes, probably obtained from experience. An alternative embodiment may comprise a kind of usage meter, e.g., a clock, an energy consumption meter, etc. and the attenuation control means ACM may automatically change its control properties according to that meter reading, e.g., on the basis of predefined schemes.

In more sophisticated embodiments, the attenuation control means ACM uses information on, e.g., the lamp's power consumption, voltage, etc. obtained from a lamp driver reference signal LRS to determine the currently most correct control properties.

In a further alternative embodiment, the attenuation control means ACM reads a light beam reference signal BRS and/or a constant light beam reference signal CRS. Such signals may be established by means of intensity measuring devices BIM, CIM, placed in the paths of the light beam LB and the constant intensity light beam CLB, respectively. Preferably, the light intensity measuring devices are small relative to the cross-sectional area of the light beams and placed in the periphery of the light beams in order to minimize the interruption of the light beams. Alternatively, the intensity measuring devices BIM, CIM may be placed outside the light beams and small mirrors or other light directing devices may be placed in the light beams to conduct a fraction of the light towards the intensity measuring devices. From the light beam reference signal BRS the attenuation control means ACM may determine the timing and magnitude of intensity peaks IP. By means of the constant light beam reference signal CRS the attenuation control means may adaptively regulate its control properties on the basis of common feedback techniques as the reading from that signal should be constant.

Further alternative embodiments comprise any combinations of the above-described embodiments and are within the scope of the present invention. A preferred advantageous embodiment is obtained by combining the use of a constant light beam reference signal CRS with an attenuation reference signal ARS, thereby enabling adaptive control of the lamp driver and multi-level variable attenuation means MVAM.

FIG. 18 illustrates one possible use of the method of the present invention in an application of a light modulating arrangement 1 used for photolithography purposes. A first part 2 of the arrangement 1 produces a focused and uniform beam of light. It comprises a lamp SAL, a lamp driver LD, a blower 25 and a fan 26, a protection glass and filter 21, a shutter 22, a multi-level variable attenuation means MVAM of the current invention, a light-integrating rod 23, and beam shaping optics 24.

The type of lamp SAL depends on the type of plate to be exposed. Possible types comprise conventional short arc bulbs, laser sources, diode arrays and more. A preferred conventional lamp may have a power consumption of 270 W but the present invention is not in any way limited to this value, or to the mentioned types of lamps. Alternatives such as 250 W and 350 W may be considered.

The light from the lamp SAL is transmitted through a filter (e.g., IR or W-filter depending on the application) 21 functioning as an interference filter and through a shutter mechanism 22 making it possible to turn off the light beam without turning off the lamp. This is important, as most lamp types need some time after start before they are stabilized. A blower 25 and a fan 26 ensure the cooling of the lamp SAL.

Subsequently the light beam is sent through a multi-level variable attenuation means MVAM of the present invention in order to reject any periodic intensity changes, and after that it is transmitted through a light-integrating rod 23. Thereby, the light is mixed, making the light throughout the beam uniform with regards to intensity. This ensures that the light in the periphery of the beam has the same intensity as the light in the center of the beam. After the light leaves the light-integrating rod 23, it is focused by beam shaping optics 24.

The next part of the arrangement 1 modulates the light beam to reflect electronically stored image data. It comprises a light-modulating means 3 and means 35 for directing the unmodulated light beam towards the light-modulating means 3 without disturbing its modulated light beam output.

Suited light-modulating means 3 comprises DMD modulators, transmissive shutters including LCD and micro-mechanical shutters and more. For the preferred embodiment of FIG. 18, a DMD light-modulating chip 31 is mounted on a PCB 32 with a cooling plate 33 and a temperature sensor 34 is used.

The light directing means 35 depends on the type of light-modulating means 3 used.

For transmissive light modulating means the unmodulated light beam is directed towards one side of the light modulating means, and the modulated light beam is emitted from the other side. In such an arrangement, the light directing means 35 might be excluded.

For DMD modulators, the unmodulated light beam is directed towards the same point as where the modulated light beam is emitted. This necessitates the use of light directing means 35. In the preferred embodiment of FIG. 18, a TIR-prism is used for light directing means. TIR is an abbreviation meaning 'Total Internal Reflection'. A TIR-prism comprises a surface 36 which will act as a mirror to light coming from one direction (from the left for this specific embodiment) and will let light coming from another direction (from the top for this specific embodiment) straight through.

The last part of the arrangement 1 focuses the multiple modulated light beams emitted from the light modulating means 3 through the light directing means 35 on an illumination surface 5, e.g., a printing plate. It comprises a set of lenses/a macro lens 41 located within a housing 4.

In order to ensure synchronization between the intensity peaks IP emitted by the lamp SAL and the attenuation applied by the multi-level variable attenuation means MVAM, an attenuation control means ACM coupled to both the lamp driver LD via a lamp driver control signal LCS and the multi-level variable attenuation means MVAM via an attenuation control means ACM. Due to clarity, illustration of possible lamp driver reference signal LRS, attenuation reference signal ARS, light beam intensity measuring device BIM, light beam reference signal BRS, constant light beam intensity measuring device CIM and constant light beam reference signal CRS is omitted but those devices and signals may preferably be added to the embodiment of FIG. 18.

It is noted that the present invention has several further uses than described above. It may, furthermore, with advantage be used, e.g., for exposing printed circuit boards in connection with the manufacture of such boards, rapid prototyping, i.e., manufacture of three-dimensional models by a process well-known as rapid prototyping, exposing offset plates and films and, e.g., in serigraphy applications, in photo finishing processes, in biomedical applications, e.g., for research regarding DNA profiles, in projection applications and signs, in digital cinema applications, etc., and in any other application or process comprising light sources and where the stability of the light of those light sources may have a certain importance.

The invention claimed is:

1. A method for establishing a light beam with substantially constant luminous intensity, comprising the steps of:
    establishing a light beam by means of a light source; and
    controlling an attenuation of said light beam on the basis of occurrences of luminous intensity peaks in said light beam; and wherein
    said controlling an attenuation step comprises applying a first level of attenuation to said light beam at times where the luminous intensity of said light beam assumes a magnitude of an intensity floor and applying a further level of attenuation to the said light beam at times where luminous intensity peaks occur; and
    said further level of attenuation step is proportioned to the magnitude differences between said luminous intensity peaks and said luminous intensity floor.

2. A method for establishing a light beam according to claim 1, wherein said luminous intensity peaks occur periodically.

3. A method for establishing a light beam according to claim 1, wherein said luminous intensity peaks may at least within a particular time interval be considered of substantially equal magnitude.

4. A method for establishing a light beam according to claim 3, wherein said particular time interval is at least 50 hours.

5. A method for establishing a light beam according to claim 1, wherein said attenuation is achieved by a variable attenuation device.

6. A method for establishing a light beam according to claim 5, wherein said variable attenuation device is capable of applying at least two different levels of attenuation to said light beam.

7. A method for establishing a light beam according to claim 6, wherein one of said at least two different levels of attenuation represents substantially no attenuation.

8. A method for establishing a light beam according to claim 7, wherein an attenuation control device is coupled to said variable attenuation device.

9. A method for establishing a light beam according to claim 8, wherein said attenuation control device controls which of said at least two different levels of attenuation that is applied to said light beam by an attenuation control signal.

10. A method for establishing a light beam according to claim 9, wherein said attenuation control device is coupled to a lamp driver that drives said light source.

11. A method for establishing a light beam according to claim 10, wherein said attenuation control device controls a timing of said luminous intensity peaks by a lamp driver control signal.

12. A method for establishing a light beam according to claim 11, wherein said attenuation control device receives a light beam reference signal derived from an intensity measuring device adapted to measure the intensity of the light beam.

13. A method for establishing a light beam according to claim 12, wherein said attenuation control device receives a constant light beam reference signal derived from an intensity measuring device adapted to measure the intensity of said substantially constant intensity light beam.

14. A method for establishing a light beam according to claim 13, wherein said attenuation control device controls properties of said luminous intensity peaks by said lamp driver control signal at least partly on the basis of said light beam reference signal, said constant light beam reference signal or a combination thereof.

15. A method for establishing a light beam according to claim 13, wherein said attenuation control device controls which of said at least two different levels of attenuation that is applied to said light beam by said attenuation control signal at least partly on the basis of said light beam reference signal, said constant light beam reference signal or a combination thereof.

16. A method for establishing a light beam according to claim 10, wherein said attenuation control device controls a magnitude of said luminous intensity peaks by a lamp driver control signal.

17. A method for establishing a light beam according to claim 16, wherein said attenuation control device receives an attenuation reference signal comprising information on properties of said variable attenuation device.

18. A method for establishing a light beam according to claim 17, wherein said attenuation control device controls properties of said luminous intensity peaks by said lamp driver control signal at least partly on the basis of said attenuation reference signal.

19. A method for establishing a light beam according to claim 10, wherein said attenuation control device controls said variable attenuation device, said lamp driver or both at least partly on a basis of predefined settings.

20. A method for establishing a light beam according to claim 10, wherein said attenuation control device continuously controls said variable attenuation device, said lamp driver, or both.

21. A method for establishing a light beam according to claim 10, wherein said lamp driver establishes an alternating current with current peaks for driving said light source.

22. A method for establishing a light beam according to claim 10, wherein said lamp driver establishes a direct current with current peaks for driving said light source.

23. A method for establishing a light beam according to claim 8, wherein said attenuation control device receives a lamp driver reference signal comprising information on properties of said luminous intensity peaks.

24. A method for establishing a light beam according to claim 23, wherein said attenuation control device controls which of said at least two different levels of attenuation that is applied to said light beam by said attenuation control signal at least partly on the basis of said lamp driver reference signal.

25. A method for establishing a light beam according to claim 23, wherein said variable attenuation device is a multi-level variable attenuation device.

26. A method for establishing a light beam according to claim 25, wherein said multi-level variable attenuation device is capable of applying infinite levels of attenuation to said light beam.

27. A method for establishing a light beam according to claim 26, wherein said attenuation control device controls which of said infinite levels of attenuation that said multi-level variable attenuation device applies to the light beam at least partly on the basis of a magnitude difference between the intensity peaks and the intensity floor.

28. A method for establishing a light beam according to claim 27, wherein said attenuation control device regulates which of said infinite levels of attenuation that said multi-level variable attenuation device applies to the light beam at least partly on the basis of feedback from a constant light beam intensity measuring device.

29. A method for establishing a light beam according to claim 26, wherein said attenuation control device controls which of said infinite levels of attenuation that said multi-level variable attenuation device applies to the light beam at least partly on the basis of user input.

30. A method for establishing a light beam according to claim 26, wherein said attenuation control device controls which of said infinite levels of attenuation that said multi-level variable attenuation device applies to the light beam at least partly on the basis of said lamp driver reference signal.

31. A method for establishing a light beam according to claim 25, wherein said attenuation control device controls which of said infinite levels of attenuation that said multi-level variable attenuation device applies to the light beam at least partly on the basis of an elapsed time of light source usage.

32. A method for establishing a light beam according to claim 8, wherein said attenuation control device establishes a synchronization between a timing of the application of said first and further levels of attenuation and the timing of said luminous intensity peaks.

33. A method for establishing a light beam according to claim 8, wherein said attenuation control device promotes compensation for light beam property changes caused by prolonged use of said light source.

34. A method for establishing a light beam according to claim 33, wherein said light beam property changes comprise intensity peak magnitude changes.

35. A method for establishing a light beam according to claim 1, wherein the luminous intensity of said established light beam with substantially constant luminous intensity is completely constant.

36. A method for establishing a light beam according to claim 1, wherein the luminous intensity of said established light beam with substantially constant luminous intensity is constant within a tolerance of ±50%.

37. A method for establishing a light beam according to claim 36, wherein the luminous energy conducted by said established light beam with substantially constant luminous intensity during one peaking period is within ±10% of the luminous energy conducted during a nominal period.

38. A method for establishing a light beam according to claim 1, wherein said light source is a short arc lamp.

39. Use of said method according to claim 1 in a light modulating arrangement used for photolithography.

40. Use of said method according to claim 1 in a light modulating arrangement used for image projection.

41. An apparatus establishing a light beam with substantially constant luminous intensity, comprising:
 a light source establishing a light beam;
 a variable attenuation device;
 an attenuation control device; and
 wherein said light beam is moderated to have a substantially constant luminous intensity in accordance with said method set forth in claim 1.

* * * * *